United States Patent
Sato et al.

(10) Patent No.: US 8,932,903 B2
(45) Date of Patent: Jan. 13, 2015

(54) METHOD FOR FORMING WIRING, SEMICONDUCTOR DEVICE, AND METHOD FOR MANUFACTURING SEMICONDUCTOR DEVICE

(71) Applicant: Semiconductor Energy Laboratory Co., Ltd., Atsugi (JP)

(72) Inventors: Takahiro Sato, Tochigi (JP); Takayuki Cho, Tochigi (JP); Shunsuke Koshioka, Tochigi (JP); Tetsuya Ohshima, Tochigi (JP); Naoya Sakamoto, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/875,563

(22) Filed: May 2, 2013

(65) Prior Publication Data

US 2013/0302938 A1    Nov. 14, 2013

(30) Foreign Application Priority Data

May 10, 2012    (JP) .................................. 2012-108832

(51) Int. Cl.
  *H01L 21/00*    (2006.01)
  *H01L 29/66*    (2006.01)
  *H05K 3/06*    (2006.01)
  *H01L 27/12*    (2006.01)

(52) U.S. Cl.
  CPC ............ *H01L 29/66969* (2013.01); *H05K 3/06* (2013.01); *H01L 27/124* (2013.01); *H01L 27/1255* (2013.01); *H01L 27/1225* (2013.01)
  USPC ............................................. 438/104; 216/13

(58) Field of Classification Search
  CPC ...................... H01L 29/66969; H01L 27/1225; H01L 27/1255; H01L 27/124; H01L 21/31; H01L 21/30608; H01L 21/3083; H05K 3/06
  USPC .................................................. 438/104, 705
  See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Reema Patel
*Assistant Examiner* — Syed Gheyas
(74) *Attorney, Agent, or Firm* — Eric J. Robinson; Robinson Intellectual Property Law Office, P.C.

(57) ABSTRACT

A wiring which is formed using a conductive film containing copper and whose shape is controlled is provided. A transistor including an electrode which is formed in the same layer as the wiring is provided. Further, a semiconductor device including the transistor and the wiring is provided. A resist mask is formed over a second conductive film stacked over a first conductive film; part of the second conductive film and part of the first conductive film are removed with use of the resist mask as a mask so that the first conductive film has a taper angle greater than or equal to 15° and less than or equal to 45°; and the resist mask is removed. The first conductive film contains copper.

5 Claims, 13 Drawing Sheets

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,928,441 B2* | 4/2011 | Lee et al. | 257/59 |
| 8,173,492 B2* | 5/2012 | Lee et al. | 438/149 |
| 2001/0041392 A1* | 11/2001 | Suzawa et al. | 438/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0295041 A1 | 11/2010 | Kumomi et al. | |
| 2011/0227085 A1* | 9/2011 | Nakamura et al. | 257/59 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

(56) References Cited

OTHER PUBLICATIONS

Nakamura.M et al., "The phase relations in the In2O3—Ga2ZnO4—ZnO system at 1350°C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O—-ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 563, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-cystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Syposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 624-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase", ", Physics Letter, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symosium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 :SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga, or Al;B: Mg, Mn, Fe, Ni, Cu or Zn] At Temperatures Over 1000° C., ", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

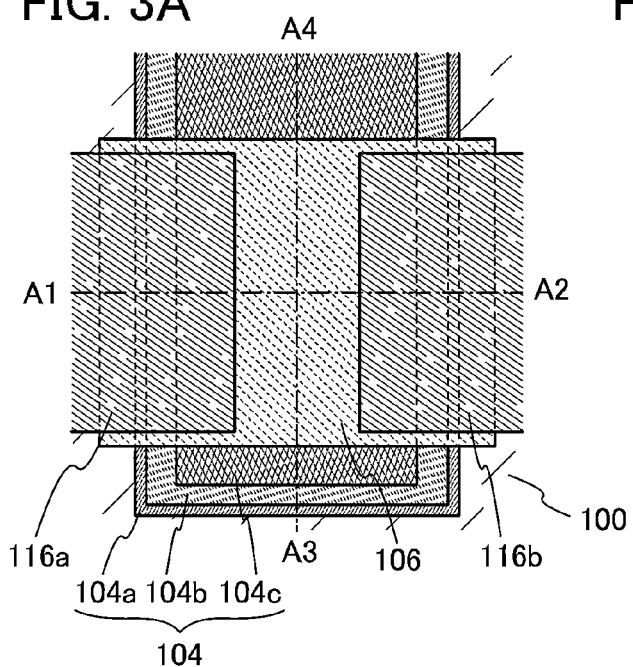
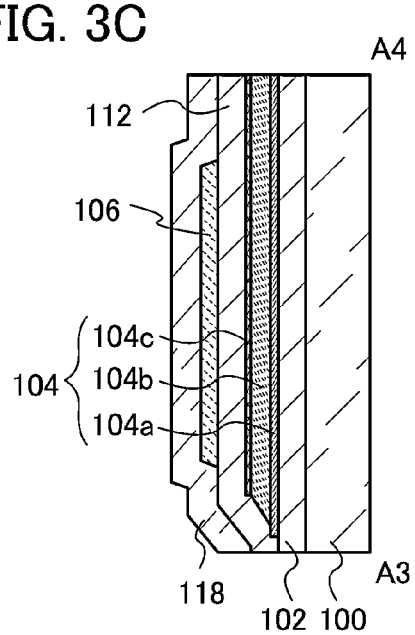
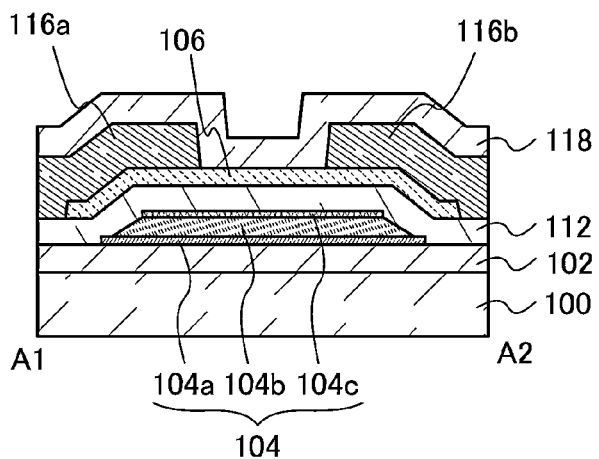

METHOD FOR FORMING WIRING, SEMICONDUCTOR DEVICE, AND METHOD FOR MANUFACTURING SEMICONDUCTOR DEVICE

BACKGROUND OF THE INVENTION

1. Field of the Invention

The present invention relates to a wiring, a method for forming the wiring, a semiconductor device, and a method for manufacturing the semiconductor device.

Note that in this specification, a semiconductor device refers to any device that can function by utilizing semiconductor characteristics, and an electro-optical device, a semiconductor circuit, an electronic device, and the like are all semiconductor devices.

Further, the present invention relates to an object, a method, a manufacturing method, a process, a machine, manufacture, or a composition of matter. The present invention relates to, for example, a semiconductor device, a display device, a liquid crystal display device, a light-emitting device, a driving method thereof, or a production method thereof. In particular, the present invention relates to, for example, a display device, a light-emitting device, or a driving method thereof.

2. Description of the Related Art

A technique for forming a transistor by using a semiconductor film formed over a substrate having an insulating surface has attracted attention. The transistor is applied to a wide range of semiconductor devices such as an integrated circuit and a display device. A silicon-based semiconductor film is known as a semiconductor film applicable to a transistor.

As a silicon-based semiconductor film which is used as a semiconductor film of a transistor, either an amorphous silicon film or a polycrystalline silicon film is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or laser light treatment which is performed on an amorphous silicon film has been known.

Further, in recent years, a transistor including an oxide semiconductor film has attracted attention. For example, a transistor which includes an amorphous oxide film containing indium, gallium, and zinc and having a carrier density lower than $10^{18}$ cm$^{-3}$ is disclosed (see Patent Document 1).

An oxide semiconductor film can be formed by a sputtering method or the like and therefore can be applied to a transistor included in a large-sized display device. Moreover, a transistor including an oxide semiconductor film has a high field-effect mobility; therefore, a high-definition display device or a high-performance display device where driver circuits are formed over the same substrate can be obtained. In addition, there is an advantage that capital investment can be reduced because part of production equipment for a transistor including an amorphous silicon film can be retrofitted and utilized.

When the size of a display device is increased, the lengths of wirings are increased. Further, when the definition of a display device is increased, wirings need to be reduced in width and thickness accordingly. Thus, an increase in size and/or definition of a display device leads to an increase in wiring resistance. In other words, an increase in size and/or definition of a display device might cause a problem such as signal delay (also referred to as wiring delay) due to wiring resistance.

In order to reduce wiring resistance, use of a conductive film containing copper, which has low resistance, for wirings has been proposed. However, methods for etching a conductive film containing copper are mostly etching using a chemical solution, which is isotropic etching. Therefore, it has been difficult to control the shape of the conductive film containing copper after the etching. In the case where the conductive film containing copper has a large taper angle, for example, a shape defect of a layer over the conductive film containing copper might be caused.

REFERENCE

Patent Document

[Patent Document 1] Japanese Published Patent Application No. 2006-165528

SUMMARY OF THE INVENTION

An object is to provide a wiring which is formed using a conductive film containing copper and whose shape is controlled. Another object is to provide a transistor including an electrode which is formed in the same layer as the wiring. Another object is to provide a semiconductor device including the transistor and the wiring.

Further, an object is to provide a highly reliable semiconductor device or the like. Another object is to provide a transistor or the like having stable electric characteristics. Another object is to provide a transistor or the like having low off-state current. Another object is to provide a transistor or the like having high field-effect mobility. Another object is to provide a transistor or the like with high yield. Another object is to provide a semiconductor device or the like including the transistor or the like. Another object is to provide a novel semiconductor device or the like.

Note that the description of these objects does not impede the existence of other objects. Note that in one embodiment of the present invention, there is no need to achieve all the objects. Other objects will be apparent from and can be derived from the description of the specification, the drawings, the claims, and the like.

One embodiment of the present invention is a method for forming a wiring, including the steps of forming a resist mask over a second conductive film stacked over a first conductive film; removing part of the second conductive film and part of the first conductive film with use of the resist mask as a mask so that the first conductive film has a taper angle greater than or equal to 15° and less than or equal to 45°; and removing the resist mask. The first conductive film contains copper.

Another embodiment of the present invention is a method for forming a wiring, including the steps of forming a resist mask over a second conductive film stacked over a first conductive film; removing part of the second conductive film with use of the resist mask as a mask; removing part of the first conductive film with use of the resist mask and the partly etched second conductive film as masks so that the first conductive film has a taper angle greater than or equal to 15° and less than or equal to 45°; removing the resist mask; and removing a region of the partly etched second conductive film, the region not being in contact with the first conductive film. The first conductive film contains copper.

Note that a taper angle refers to an angle which is formed, in a cross-sectional view, at an end portion of a film by a straight line parallel to a surface on which the film is formed and a straight line parallel to a side surface of the film. In the case where the surface on which the film is formed has large unevenness, the taper angle may be calculated with use of a straight line parallel to a plane which includes three or more points on the surface on which the film is formed. In the case where the side surface of the film is curved, the taper angle may be calculated with use of a straight line which includes two points, the upper and lower ends, of the film or a straight line which includes three or more points on the side surface of the film. Note that the plane or the straight line including three or more points is determined such that the points are apart from one another by a distance greater than or equal to 3 nm or greater than or equal to 5 nm.

Here, the second conductive film is selected such that the first conductive film in a region in contact with the second conductive film is etched more rapidly than the first conductive film in a region which is not in contact with the second conductive film. Owing to selection of such the second conductive film, the region of the first conductive film which is in contact with the second conductive film is etched off earlier than the other region. Thus, a side surface of the first conductive film and a region of the first conductive film which has been in contact with the second conductive film are exposed to a chemical solution first. The first conductive film is etched more as closer to the second conductive film; thus, its upper portion is more etched and its lower portion is less etched as the etching progresses. Consequently, the first conductive film can have a taper angle greater than or equal to 15° and less than or equal to 45°. In this case, a region which is not in contact with the first conductive film is formed in the partly etched second conductive film.

Note that the etching of the conductive film containing copper may be performed by a wet etching method using a chemical solution. A chemical solution containing an oxidizer and acid is used as the chemical solution, whereby the etching rate of the conductive film containing copper can be increased. Examples of an oxidizer include hydrogen peroxide, persulfuric acid, nitric acid, hypochlorous acid, permanganic acid, and dichromic acid. Examples of acid include carboxylic acid, phosphoric acid, hydrochloric acid, and acetic acid. In order to process the wiring minutely, a surfactant may be contained in the chemical solution.

As the second conductive film, a cobalt film or a conductive film which is less likely to be oxidized than a cobalt film may be used. A cobalt film or a conductive film which is less likely to be oxidized than a cobalt film and is more likely to be oxidized than a copper film is preferably used as the second conductive film. By using the cobalt film or the conductive film which is less likely to be oxidized than a cobalt film and is more likely to be oxidized than a copper film as the second conductive film, the second conductive film is preferentially oxidized by the oxidizer first in a region where the first conductive film and the second conductive film contact each other. Next, oxygen in the oxidized second conductive film partly moves to the first conductive film, whereby the copper contained in the first conductive film is oxidized. Then, the oxidized copper can be etched by the acid. Consequently, the etching rate of the first conductive film can be increased in the region where the first conductive film and the second conductive film contact each other.

Note that indicators of the likelihood of a conductive film being oxidized are ionization tendency (high tendency indicates high likelihood of oxidation), oxidation-reduction potential (low potential indicates high likelihood of oxidation), Gibbs free energy (low energy indicates high likelihood of oxidation), and the like.

Ionization potential means energy needed for removing an electron from an atom or the like to ionize the atom or the like. That is, low ionization potential of an atom indicates high likelihood of the atom being ionized. Table 1 shows the first ionization potential and the second ionization potential of typical atoms. For example, a conductive film containing an element whose first ionization potential is higher than or equal to that of molybdenum may be used as the second conductive film.

TABLE 1

|  | First ionization potential | Second ionization potential |
| --- | --- | --- |
| Titanium | 658.8 kJ/mol | 1309.8 kJ/mol |
| Chromium | 652.9 kJ/mol | 1590.6 kJ/mol |
| Cobalt | 760.4 kJ/mol | 1648.0 kJ/mol |
| Molybdenum | 684.3 kJ/mol | 1560.0 kJ/mol |
| Copper | 745.5 kJ/mol | 1957.9 kJ/mol |
| Tin | 708.6 kJ/mol | 1411.8 kJ/mol |
| Tantalum | 761.0 kJ/mol | 1500.0 kJ/mol |
| Tungsten | 770.0 kJ/mol | 1700.0 kJ/mol |

As a cobalt film or a conductive film which is less likely to be oxidized than a cobalt film, specifically, a conductive film containing one or more elements selected from tungsten, cobalt, nickel, tin, molybdenum, ruthenium, iridium, silver, palladium, platinum, and gold may be used. Among conductive films containing the above elements, a conductive film containing one or more elements selected from tungsten, cobalt, nickel, tin, and molybdenum may be used as a conductive film which is more likely to be oxidized than a copper film.

Alternatively, a conductive film containing an element which is alloyed with copper may be used as the second conductive film. When the etching rate of an alloy film of copper and the element contained in the second conductive film is higher than that of the first conductive film, the first conductive film in the region in contact with the second conductive film can be etched more rapidly than in a region which is not in contact with the second conductive film.

Alternatively, a conductive film which has a catalytic function and thus can increase the etching rate of copper may be used as the second conductive film.

One embodiment of the present invention is a method for forming a wiring, in which after a first conductive film is processed to have a taper angle greater than or equal to 15° and less than or equal to 45°, a resist mask is removed, and then a region of a partly etched second conductive film which is not in contact with the first conductive film is removed. As a method for removing the region, a wet etching method or a dry etching method may be used, for example. Alternatively, the region may be physically removed by ultrasonic cleaning and/or twin-fluid cleaning (a cleaning method in which pure water, hydrogenated water, carbonated water, or the like is sprayed together with nitrogen, air, or the like). The ultrasonic cleaning is preferably megahertz ultrasonic cleaning (megasonic cleaning). Note that the partly etched second conductive film may be entirely removed by etching.

In the case where the adhesion of the first conductive film to a surface on which the first conductive film is formed (a substrate or a base insulating film) is poor or the case where copper contained in the first conductive film might be diffused outside the wiring to cause an adverse effect, a base film having good adhesion to the first conductive film may be provided under the first conductive film. The base film may be an insulating film or a conductive film. The base film preferably contains nitrogen, in which case the diffusion coefficient of copper can be reduced. As the base film, for example, an insulating film such as a silicon nitride film, a silicon nitride oxide film, an aluminum nitride film, or an aluminum oxide film or a conductive film such as a titanium film, a titanium nitride film, a tantalum film, a tantalum nitride film, a chromium film, a chromium nitride film, a niobium film, or a niobium nitride film may be used.

As described above, a wiring according to one embodiment of the present invention has low resistance because a first conductive film contains copper. Further, since the taper angle at an end portion of the first conductive film can be greater than or equal to 15° and less than or equal to 45°, a shape defect of a layer over the wiring can be prevented from being caused.

Another embodiment of the present invention is a semiconductor device including the above wiring. Part of the wiring may function as an electrode (a gate electrode, a source electrode, or a drain electrode) of a transistor included in the semiconductor device, for example. In other words, a transistor according to one embodiment of the present invention is a transistor in which the structure of the wiring is applied to at least one of a gate electrode, a source electrode, and a drain electrode.

Specifically, one embodiment of the present invention is a method for manufacturing a semiconductor device, including the steps of forming a gate electrode by forming a resist mask over a second conductive film stacked over a first conductive film, removing part of the second conductive film and part of the first conductive film with use of the resist mask as a mask so that the first conductive film has a taper angle greater than or equal to 15° and less than or equal to 45°, and removing the resist mask; forming a gate insulating film over the gate electrode; forming a semiconductor film overlapping with the gate electrode with the gate insulating film therebetween; and forming a pair of electrodes in contact with the semiconductor film. The first conductive film contains copper.

Another embodiment of the present invention is a semiconductor device including a gate electrode including a first conductive film containing copper and having a taper angle greater than or equal to 15° and less than or equal to 45° and a second conductive film being over the first conductive film and containing at least one of tungsten, cobalt, nickel, tin, and molybdenum; a gate insulating film over the gate electrode; a semiconductor film over the gate electrode with the gate insulating film therebetween; and a pair of electrodes over the semiconductor film.

Note that although a semiconductor device including a transistor which has what is called a bottom-gate top-contact structure (also called a channel-etched structure) is described here, one embodiment of the present invention is not limited to this structure. For example, one embodiment of the present invention can be applied to a staggered transistor having any of a bottom-gate bottom-contact structure, a top-gate top-contact structure, a top-gate bottom-contact structure, and the like or a coplanar transistor.

For the semiconductor film (or semiconductor substrate) used in the semiconductor device, a silicon semiconductor such as amorphous silicon or crystalline silicon, a compound semiconductor such as gallium arsenide, silicon carbide, gallium nitride, or an oxide semiconductor, an organic semiconductor, or the like may be used. It is preferable to use an oxide semiconductor film.

As the gate insulating film used in the semiconductor device, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films may be used. It is preferable to use a single layer of an insulating film such as a silicon oxide film, a silicon oxynitride film, a silicon nitride oxide film, or a silicon nitride film or a stack of any of these insulating films. For example, in the case where part of the above-described wiring is used as the gate electrode of the transistor, the gate electrode contains copper. When the copper contained in the gate electrode reaches the semiconductor film, the electric characteristics of the transistor might be degraded; thus, it is preferable to use an insulating film which has a low diffusion coefficient of copper in at least part of the gate insulating film. For example, a silicon nitride film and a silicon nitride oxide film are insulating films having a low diffusion coefficient of copper.

According to one embodiment of the present invention, a wiring and/or an electrode can be reduced in resistance. Thus, wiring delay due to an increase in size or definition of a display device can be reduced, for example, so that a display device with high display quality can be manufactured. Further, the wiring and/or the electrode can have a taper angle greater than or equal to 15° and less than or equal to 45°. Thus, a shape defect of a layer over the wiring and/or the electrode can be prevented from being caused, so that a display device can be manufactured with high yield.

Note that a semiconductor device according to one embodiment of the present invention is not limited to a display device; one embodiment of the present invention can be applied to another semiconductor device which includes the wiring and/or the electrode. The effect of reducing wiring delay or the like can be obtained also in the case of another semiconductor device.

A wiring which is formed using a conductive film containing copper and whose shape is controlled can be provided. A transistor including an electrode which is formed in the same layer as the wiring can be provided. Further, a semiconductor device including the transistor and the wiring can be provided.

BRIEF DESCRIPTION OF THE DRAWINGS

FIGS. 3A to 3C are a top view and cross-sectional views which illustrate an example of a transistor according to one embodiment of the present invention.

DETAILED DESCRIPTION OF THE INVENTION

Figure 1A:
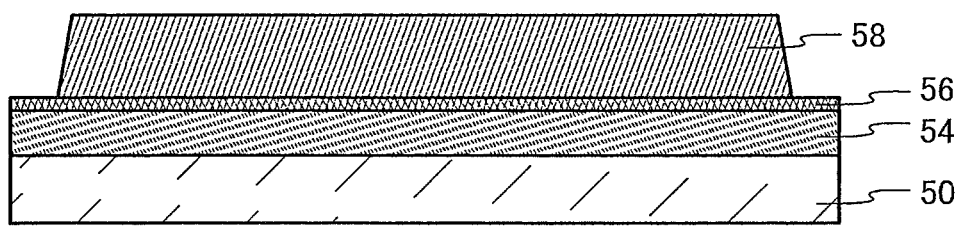
FIGS. 1A to 1D are cross-sectional views illustrating a method for forming a wiring according to one embodiment of the present invention.

Embodiments and an example of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments and the example. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that a voltage refers to a potential difference between a certain potential and a reference potential (e.g., a ground potential (GND) or a source potential) in many cases. Accordingly, a voltage can also be called a potential.

Even when the expression "to be electrically connected" is used in this specification, there is a case in which no physical connection is made and a wiring is just extended in an actual circuit.

Note that the ordinal numbers such as "first" and "second" in this specification are used for convenience and do not denote the order of steps or the stacking order of layers. In addition, the ordinal numbers in this specification do not denote particular names which specify the present invention.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

Embodiment 1

In this embodiment, a wiring according to one embodiment of the present invention and a method for forming the wiring are described.

FIGS. 1A to 1D are cross-sectional views illustrating an example of a method for forming a wiring according to one embodiment of the present invention.

First, a resist mask 58 is provided over a stack in which a conductive film 54 containing copper and a conductive film 56 are stacked in this order over a substrate 50 (see FIG. 1A).

Note that a cobalt film or a conductive film which is less likely to be oxidized than a cobalt film is used as the conductive film 56. A cobalt film or a conductive film which is less likely to be oxidized than a cobalt film and is more likely to be oxidized than a copper film is preferably used as the conductive film 56.

As a cobalt film or a conductive film which is less likely to be oxidized than a cobalt film, specifically, a conductive film containing one or more elements selected from tungsten, cobalt, nickel, tin, molybdenum, ruthenium, iridium, silver, palladium, platinum, and gold may be used. Among conductive films containing the above elements, a conductive film containing one or more elements selected from tungsten, cobalt, nickel, tin, and molybdenum may be used as a conductive film which is more likely to be oxidized than a copper film.

Figure 1B:
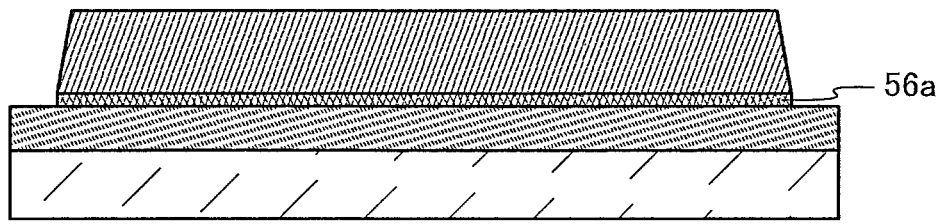

Next, the conductive film 56 is etched with use of the resist mask 58 as a mask, whereby a conductive film 56a is formed (see FIG. 1B). At this time, the conductive film 56 is etched under a condition where the etching rate of the conductive film 54 is low (or where the conductive film 54 is not etched).

Next, the conductive film 54 is etched with use of the resist mask 58 and the conductive film 56a as masks. A wet etching method may be used for the etching of the conductive film 54. Specifically, a chemical solution containing an oxidizer and acid is used as a chemical solution. By using a chemical solution containing an oxidizer and acid, the etching rate of the conductive film containing copper can be increased. Examples of an oxidizer include hydrogen peroxide, persulfuric acid, nitric acid, hypochlorous acid, permanganic acid, and dichromic acid. Examples of acid include carboxylic acid, phosphoric acid, hydrochloric acid, and acetic acid. In order to process the wiring minutely, a surfactant may be contained in the chemical solution.

Although not described in detail in this embodiment, the conductive film 56a may also be etched in the etching of the conductive film 54. In that case, a later step of removing a region of the conductive film 56a which is not in contact with a conductive film 54a becomes unnecessary.

The conductive film 56a is a cobalt film or a conductive film which is less likely to be oxidized than a cobalt film and is more likely to be oxidized than a copper film. Therefore, the conductive film 56a is preferentially oxidized by the oxidizer first in a region where the conductive film 54 and the conductive film 56a contact each other. Next, oxygen in the oxidized conductive film 56a partly moves to the conductive film 54, whereby the copper contained in the conductive film 54 is oxidized. Then, the oxidized copper can be etched by the acid. Consequently, the etching rate of the conductive film 54 can be increased in that region. The conductive film 54a having a taper angle greater than or equal to 15° and less than or equal to 45° can be formed by etching the conductive film 54 in this structure. In this case, the oxidized conductive film 56a has a region which is not in contact with the conductive film 54a.

The thickness of the conductive film 56a may be, for example, greater than or equal to 1 nm and less than or equal to 100 nm, preferably greater than or equal to 2 nm and less than or equal to 50 nm, further preferably greater than or equal to 2 nm and less than or equal to 20 nm. The conductive film 56a preferably has a large thickness, in which case the conductive film 54a can have a uniform shape. However, in some cases, large thickness makes it difficult to remove part of the conductive film 56a later.

In this embodiment, the etching rate of the conductive film 54 is increased in the region where the conductive film 54 and the conductive film 56a contact each other by utilizing a difference in the likelihood of the conductive film 54 and the conductive film 56a being oxidized; however, one embodiment of the present invention is not limited thereto. For example, a conductive film containing an element which is alloyed with copper may be used as the conductive film 56. When the etching rate of an alloy film of copper and the element contained in the conductive film 56 is higher than that of the conductive film 54, the conductive film 54 in the region in contact with the conductive film 56a can be etched more rapidly than in a region which is not in contact with the conductive film 56a.

Alternatively, a conductive film which has a catalytic function and thus can increase the etching rate of copper may be used as the conductive film 56.

Figure 1C:
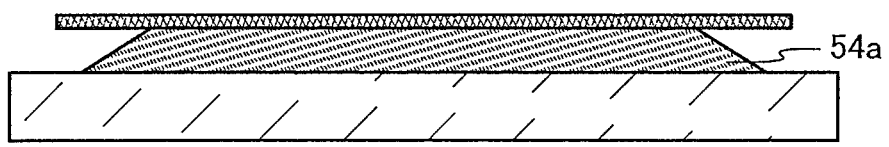

Next, the resist mask 58 is removed (see FIG. 1C).

Figure 1D:
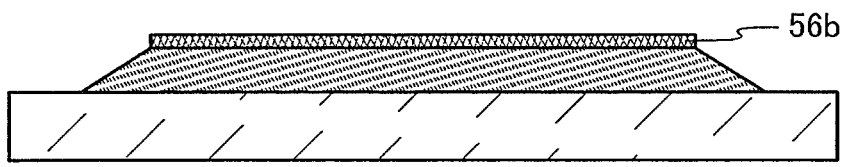

Next, a region of the conductive film 56a which is not in contact with the conductive film 54a is removed, whereby a conductive film 56b is formed (see FIG. 1D).

As a method for removing the region of the conductive film 56a which is not in contact with the conductive film 54a, a wet etching method or a dry etching method may be used, for example. At this time, the conductive film 56a is etched under a condition where the etching rate of the conductive film 54a is low. Alternatively, the region of the conductive film 56a which is not in contact with the conductive film 54a may be physically removed by ultrasonic cleaning and/or twin-fluid cleaning. The ultrasonic cleaning is preferably megahertz ultrasonic cleaning (megasonic cleaning). Note that the conductive film 56a may be entirely removed by the etching. In that case, the conductive film 56b is not formed.

In this manner, a wiring including the conductive film 54a having a taper angle greater than or equal to 15° and less than or equal to 45° and the conductive film 56b over the conductive film 54a can be formed. The wiring has low resistance because the conductive film 54a contains copper. Further, since the taper angle of the conductive film 54a can be greater than or equal to 15° and less than or equal to 45°, a shape defect of a layer over the wiring can be prevented from being caused.

Next, a method for forming a wiring which has a structure different from that in FIGS. 1A to 1D is described with reference to FIGS. 2A to 2E.

In a wiring structure in FIGS. 2A to 2E, a base film is provided in addition to the wiring structure in FIGS. 1A to 1D to improve the adhesion of the conductive film containing copper and/or to reduce diffusion of copper. The description on FIGS. 1A to 1D can be referred to for points which are not particularly explained.

Figure 2A:
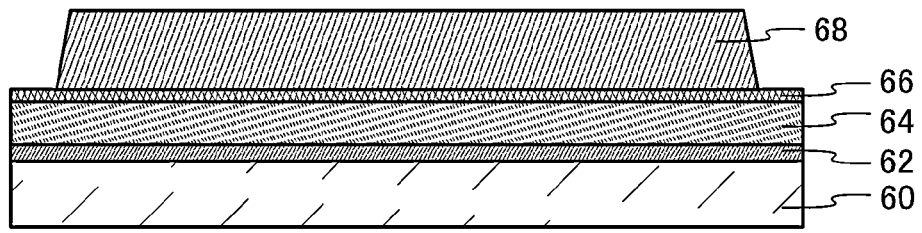
FIGS. 2A to 2E are cross-sectional views illustrating a method for forming a wiring according to one embodiment of the present invention.

First, a resist mask 68 is provided over a stack in which a conductive film 62, a conductive film 64 containing copper, and a conductive film 66 are stacked in this order over a substrate 60 (see FIG. 2A).

By thus providing the conductive film 62 having good adhesion to the conductive film 64 under the conductive film 64, peeling of the conductive film 64 can be prevented. Moreover, by providing the conductive film 62 having a low diffusion coefficient of copper, the copper contained in the conductive film 64 can be prevented from being diffused outside the wiring and causing an adverse effect. For example, a conductive film such as a titanium film, a titanium nitride film, a tantalum film, a tantalum nitride film, a chromium film, a chromium nitride film, a niobium film, or a niobium nitride film is used as such a conductive film 62.

Note that an insulating film may be provided instead of the conductive film 62. In that case, for example, an insulating film such as a silicon nitride film, a silicon nitride oxide film, an aluminum nitride film, or an aluminum oxide film is used.

The conductive film 62 (or the insulating film used instead) preferably contains nitrogen, in which case the conductive film 62 (or the insulating film used instead) can have a low diffusion coefficient of copper.

Refer to the description of the conductive film 56 for the conductive film 66.

Figure 2B:
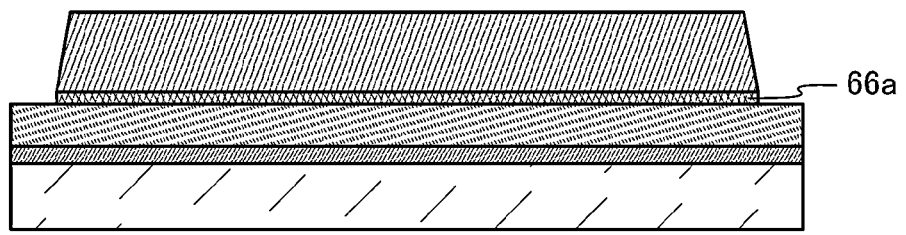

Next, the conductive film 66 is etched with use of the resist mask 68 as a mask, whereby a conductive film 66a is formed (see FIG. 2B). At this time, the conductive film 66 is etched under a condition where the etching rate of the conductive film 64 is low.

Next, the conductive film 64 is etched with use of the resist mask 68 and the conductive film 66a as masks. Refer to the description of the etching of the conductive film 54 for the etching of the conductive film 64.

Figure 2C:
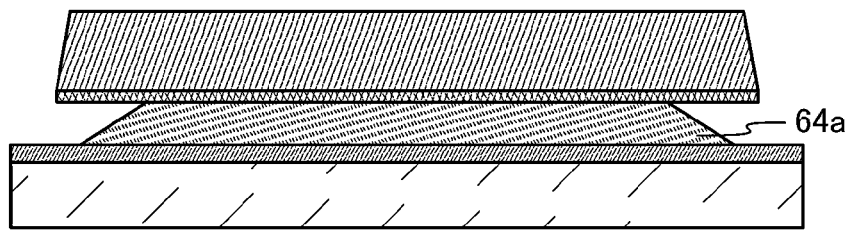

A conductive film 64a having a taper angle greater than or equal to 15° and less than or equal to 45° can be formed by etching the conductive film 64 (see FIG. 2C).

Next, the conductive film 62 is etched with use of the resist mask 68 and the conductive film 66a as masks, whereby a conductive film 62a is formed. In the case where an insulating film is used instead of the conductive film 62, this etching is not necessarily performed.

Figure 2D:
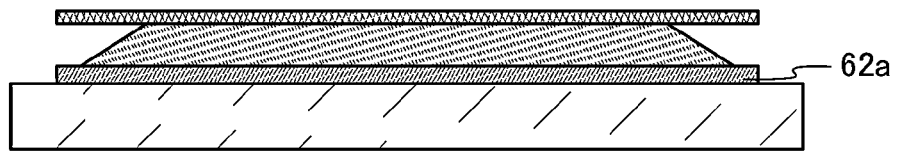

Then, the resist mask 68 is removed (see FIG. 2D).

Figure 2E:
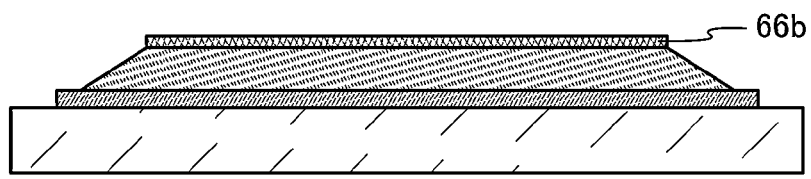

Next, a region of the conductive film 66a which is not in contact with the conductive film 64a is removed, whereby a conductive film 66b is formed (see FIG. 2E).

Refer to the description of the method for removing a region of the conductive film 56a which is not in contact with the conductive film 54a for a method for removing a region of the conductive film 66a which is not in contact with the conductive film 64a.

In this manner, a wiring including the conductive film 62a, the conductive film 64a having a taper angle greater than or equal to 15° and less than or equal to 45° over the conductive film 62a, and the conductive film 66b over the conductive film 64a can be formed. The wiring has low resistance because the conductive film 64a contains copper. Further, since the taper angle of the conductive film 64a can be greater than or equal to 15° and less than or equal to 45°, a shape defect of a layer over the wiring can be prevented from being caused. The conductive film 62a can improve the adhesion of the conductive film 64a. Thus, peeling of the conductive film 64a can be prevented and the yield of the wiring can be improved.

The wiring and the method for forming the wiring described in this embodiment can be applied to a wiring and/or an electrode of a semiconductor device or the like.

This embodiment can be implemented in appropriate combination with any of the other embodiments and example.

Embodiment 2

In this embodiment, a transistor according to one embodiment of the present invention and a method for manufacturing the transistor will be described.

FIG. 3A is a top view of a transistor according to one embodiment of the present invention. FIG. 3B is a cross-sectional view along dashed-dotted line A1-A2 of FIG. 3A. FIG. 3C is a cross-sectional view along dashed-dotted line A3-A4 in FIG. 3A. Note that for simplicity, a gate insulating film 112 and the like are not illustrated in FIG. 3A.

FIG. 3B is a cross-sectional view of a transistor including a base insulating film 102 over a substrate 100, a gate electrode 104 over the base insulating film 102, the gate insulating film 112 over the gate electrode 104, an oxide semiconductor film 106 which is over the gate insulating film 112 and overlaps with the gate electrode 104, a source electrode 116a and a drain electrode 116b which are over the oxide semiconductor film 106, and a protective insulating film 118 over the oxide semiconductor film 106, the source electrode 116a, and the drain electrode 116b. Note that FIG. 3B illustrates a structure including the base insulating film 102; however, one embodiment of the present invention is not limited thereto. For example, a structure without the base insulating film 102 may be employed.

Here, the gate electrode 104 includes a conductive film 104a, a conductive film 104b containing copper, and a conductive film 104c which are stacked in this order. Refer to the descriptions of the conductive film 62a, the conductive film 64a, and the conductive film 66b in Embodiment 1 for the conductive film 104a, the conductive film 104b, and the conductive film 104c, respectively.

In other words, the gate electrode 104 has a structure similar to that of the wiring illustrated in FIGS. 2A to 2E. Although the structure of the gate electrode 104 in this embodiment is similar to that of the wiring illustrated in FIGS. 2A to 2E, one embodiment of the present invention is not limited thereto. For example, a structure similar to that of the wiring illustrated in FIGS. 1A to 1D may be applied to the gate electrode 104.

Accordingly, the description on FIGS. 1A to 1D or FIGS. 2A to 2E in Embodiment 1 may be referred to for description of the gate electrode 104.

The gate electrode 104 has low resistance because the conductive film 104b contains copper. Further, since the taper angle of the conductive film 104b can be greater than or equal to 15° and less than or equal to 45°, a shape defect of a layer over the gate electrode 104 (e.g., the gate insulating film 112) can be prevented from being caused.

In this embodiment, the oxide semiconductor film 106 is used as a semiconductor film including a channel region; however, one embodiment of the present invention is not limited thereto. Another semiconductor film may be used instead of the oxide semiconductor film 106.

The oxide semiconductor film 106 may be formed using an In-M-Zn—O compound, for example. Here, a metal element M is an element whose bond energy with oxygen is higher than that of In and that of Zn. Alternatively, the metal element M is an element which has a function of suppressing desorption of oxygen from the In-M-Zn—O compound. Owing to the effect of the metal element M, generation of oxygen vacancies in the oxide semiconductor film 106 is suppressed. Note that oxygen vacancies in an oxide semiconductor film sometimes generate carriers. Therefore, the effect of the metal element M can suppress an increase in carrier density in the oxide semiconductor film 106 and an increase in an off-state current. Moreover, a change in the electric characteristics of the transistor, which is caused by oxygen vacancies, can be reduced, so that a highly reliable transistor can be obtained.

Specifically, the metal element M may be Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. For the metal element M, one or more elements may be selected from the above elements. Further, Si or Ge may be used instead of the metal element M.

The hydrogen concentration in the oxide semiconductor film 106 is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$. This is because hydrogen included in the oxide semiconductor film 106 sometimes generates unintentional carriers. The generated carriers might increase the off-state current of the transistor and vary the electric characteristics of the transistor. Thus, when the hydrogen concentration in the oxide semiconductor film 106 is in the above range, an increase in the off-state current of the transistor and a change in the electric characteristics of the transistor can be suppressed.

A structure of an oxide semiconductor film which can be used as the oxide semiconductor film 106 is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The oxide semiconductor film 106 described above has a band gap which is wider than that of a silicon film by about 1 eV to 2 eV. For that reason, in the transistor including the oxide semiconductor film 106, impact ionization is unlikely to occur and avalanche breakdown is unlikely to occur. That is, it can be said that, in the transistor including the oxide semiconductor film 106, hot-carrier degradation is unlikely to occur.

Furthermore, carriers are unlikely to be generated in the oxide semiconductor film 106; accordingly, the channel region can be completely depleted by an electric field of the gate electrode 104 even in the case where the oxide semiconductor film 106 has a large thickness (e.g., greater than or equal to 15 nm and less than 100 nm). For that reason, in the transistor including the oxide semiconductor film 106, an increase in off-state current and a change in threshold voltage due to a punch-through phenomenon are not caused.

Oxygen vacancies in an oxide semiconductor film can be evaluated by electron spin resonance (ESR). That is, an oxide semiconductor film with few oxygen vacancies can be referred to as an oxide semiconductor film which does not have a signal due to oxygen vacancies evaluated by ESR. Specifically, the oxide semiconductor film 106 is an oxide semiconductor film whose spin density attributed to oxygen vacancies is lower than $5\times10^{16}$ spins/cm$^3$. When an oxide semiconductor film has oxygen vacancies, a symmetrical signal is found at a g value of around 1.93 in ESR.

By a significant reduction in the concentration of a donor (e.g., hydrogen or an oxygen vacancy) in the oxide semiconductor film 106, the transistor including the oxide semiconductor film 106 can have an extremely low off-state current. Specifically, the off-state current of a transistor with a channel length of 3 μm and a channel width of 1 μam can be lower than or equal to $1\times10^{-21}$ A or lower than or equal to $1\times10^{-25}$ A.

There is no particular limitation on the substrate 100. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates provided with a semiconductor element may be used as the substrate 100.

In the case where a large glass substrate such as the 5th generation (1000 mm×1200 mm or 1300 mm×1500 mm), the 6th generation (1500 mm×1800 mm), the 7th generation (1870 mm×2200 mm), the 8th generation (2200 mm×2500 mm), the 9th generation (2400 mm×2800 mm), or the 10th generation (2880 mm×3130 mm) is used as the substrate 100, minute processing is sometimes difficult due to shrinkage of the substrate 100 caused by heat treatment or the like in a manufacturing process of a semiconductor device. Therefore, in the case where the above-described large glass substrate is used as the substrate 100, a substrate which is unlikely to shrink through the heat treatment is preferably used. For example, a large glass substrate whose shrinkage by heat treatment for one hour at 400° C., preferably 450° C., further preferably 500° C. is less than or equal to 10 ppm, preferably less than or equal to 5 ppm, further preferably less than or equal to 3 ppm may be used as the substrate 100.

Further alternatively, a flexible substrate may be used as the substrate 100. Note that as a method for forming a transistor over a flexible substrate, there is a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

As the base insulating film 102, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

The source electrode 116a and the drain electrode 116b may be formed of a single layer or a stack of a simple substance selected from aluminum, titanium, chromium, cobalt, nickel, copper, yttrium, zirconium, molybdenum, silver, tantalum, and tungsten; a nitride containing one or more kinds of the above substances; an oxide containing one or more kinds of the above substances; or an alloy containing one or more kinds of the above substances. Note that the source electrode 116a and the drain electrode 116b may have the same composition or different compositions.

The source electrode 116a and the drain electrode 116b may have a structure similar to that of the wiring illustrated in FIGS. 1A to 1D or FIGS. 2A to 2E.

As the gate insulating film 112, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

As the protective insulating film 118, a single layer of an insulating film such as a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film or a stack of any of these insulating films is used. It is preferable to use a single layer of an insulating film such as a silicon oxide film, a silicon oxynitride film, a silicon nitride oxide film, or a silicon nitride film or a stack of any of these insulating films.

At least one of the gate insulating film 112 and the protective insulating film 118 is preferably an insulating film containing excess oxygen.

In the case where at least one of the gate insulating film 112 and the protective insulating film 118 contains excess oxygen, oxygen vacancies in the oxide semiconductor film 106 can be reduced.

An insulating film containing excess oxygen is an insulating film which can release oxygen by being subjected to heat treatment or the like. That is, an insulating film containing excess oxygen is an insulating film which has a function of releasing oxygen by heat treatment.

Here, to release oxygen by heat treatment means that the amount of released oxygen which is converted into oxygen atoms is greater than or equal to $1\times10^{18}$ atoms/cm³, greater than or equal to $1\times10^{19}$ atoms/cm³, or greater than or equal to $1\times10^{20}$ atoms/cm³ in thermal desorption spectroscopy (TDS) analysis.

Here, a method for measuring the amount of released oxygen using TDS analysis will be described.

The total amount of released gas from a measurement sample in TDS analysis is proportional to the integral value of the ion intensity of the released gas. Then, a comparison with a standard sample is made, whereby the total amount of released gas can be calculated.

For example, the number of released oxygen molecules ($N_{O2}$) from the measurement sample can be calculated according to Formula 1 using the TDS analysis results of a silicon wafer containing hydrogen at a predetermined density, which is the standard sample, and the TDS analysis results of the measurement sample. Here, all gases having a mass number of 32 which are obtained in the TDS analysis are assumed to originate from an oxygen molecule. CH₃OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = \frac{N_{H2}}{S_{H2}} \times S_{O2} \times \alpha \qquad \text{[FORMULA 1]}$$

$N_{H2}$ is the value obtained by conversion of the number of hydrogen molecules desorbed from the standard sample into densities. $S_{H2}$ is the integral value of ion intensity when the standard sample is analyzed by TDS. Here, the reference value of the standard sample is expressed by $N_{H2}S_{H2}$. $S_{O2}$ is the integral value of ion intensity when the measurement sample is analyzed by TDS. A coefficient affecting the ion intensity in the TDS analysis is denoted by $\alpha$. Refer to Japanese Published Patent Application No. H06-275697 for details of Formula 1. Note that the amount of released oxygen is measured with a thermal desorption spectroscopy apparatus produced by ESCO Ltd., EMD-WA1000S/W using a silicon wafer containing hydrogen atoms at $1\times10^{16}$ atoms/cm² as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

Further, to release oxygen by heat treatment means to contain a peroxide radical. Specifically, the spin density attributed to a peroxide radical is higher than or equal to $5\times10^{17}$ spins/cm³. Note that to contain a peroxide radical means to have an asymmetric signal at a g value of around 2.01 in ESR.

The insulating film containing excess oxygen may be formed using oxygen-excess silicon oxide ($SiO_X$ (X>2)). In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

In the transistor illustrated in FIGS. 3A to 3C, the gate electrode 104 has a structure similar to that of the wiring described in Embodiment 1, which has low resistance and whose shape is controlled. Therefore, when a wiring which is connected to the transistor is formed in the same layer as the gate electrode 104, the resistance of the wiring can be reduced. Further, a shape defect of a layer over the gate electrode 104 can be prevented from being caused.

Note that the conductive film 104c in the gate electrode 104 is in contact with the gate insulating film 112. Since the conductive film 104b contains copper, its work function is not so high; however, in the case where the conductive film 104c contains any of tungsten, nickel, molybdenum, ruthenium, iridium, silver, palladium, platinum, and gold, the conductive film 104c can have a work function higher than or equal to 4.7 eV. Owing to the work function higher than or equal to 4.7 eV of the conductive film 104c, an n-channel transistor which includes the gate electrode 104 tends to have a positive threshold voltage, thus having normally-off electric characteristics.

Next, a method for manufacturing the transistor in FIGS. 3A to 3C is described with reference to FIGS. 4A to 4D. For easy understanding, FIGS. 4A to 4D only illustrate cross-sectional views corresponding to FIG. 3B.

First, the base insulating film 102 is formed over the substrate 100. The base insulating film 102 can be formed using an insulating film selected from the insulating films given as examples of the base insulating film 102 and can be formed by a sputtering method, a chemical vapor deposition (CVD) method, a molecular beam epitaxy (MBE) method, an atomic layer deposition (ALD) method, or a pulsed laser deposition (PLD) method.

Figure 4A:
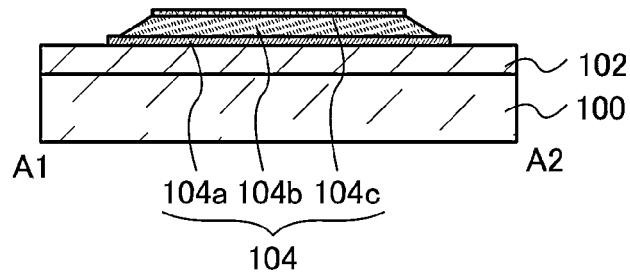
FIGS. 4A to 4D are cross-sectional views illustrating an example of a method for manufacturing a transistor according to one embodiment of the present invention.

Next, the gate electrode 104 including the conductive film 104a, the conductive film 104b, and the conductive film 104c is formed (see FIG. 4A). Refer to FIGS. 2A to 2E for a method for forming the gate electrode 104.

Next, the gate insulating film 112 is formed. The gate insulating film 112 can be formed using an insulating film selected from the insulating films given as examples of the gate insulating film 112 and can be formed by a sputtering method, a CVD method, an MBE method, an ALD method, or a PLD method.

The gate insulating film 112 is preferably a stack of a silicon nitride film or a silicon nitride oxide film and a silicon oxide film or a silicon oxynitride film. A silicon nitride film and a silicon nitride oxide film have a low diffusion coefficient of copper, and thus can prevent copper from reaching the oxide semiconductor film 106. Further, a silicon nitride film and a silicon nitride oxide film have a higher dielectric constant than a silicon oxide film and a silicon oxynitride film, and thus can have a physical thickness larger than an equivalent oxide thickness. Therefore, the silicon nitride film or the silicon nitride oxide film can prevent short circuit due to a foreign substance (e.g., dust) and reduce a decrease in step coverage, which is preferable. The silicon oxide film or the silicon oxynitride film is preferably provided on a side in contact with the oxide semiconductor film 106. Thus, the oxide semiconductor film 106 is in contact with the silicon oxide film or the silicon oxynitride film, so that nitrogen can be prevented from reaching the oxide semiconductor film 106. Since nitrogen might serve as a donor in the oxide semiconductor film 106, the silicon oxide film or the silicon oxynitride film provided on the side in contact with the oxide semiconductor film 106 can prevent the electric characteristics of the transistor from being unstable.

Then, an oxide semiconductor film to be the oxide semiconductor film 106 is formed. The oxide semiconductor film to be the oxide semiconductor film 106 can be formed using an oxide semiconductor film selected from the oxide semiconductor films given as examples of the oxide semiconductor film 106 and can be formed by a sputtering method, a CVD method, an MBE method, an ALD method, or a PLD method.

Figure 4B:
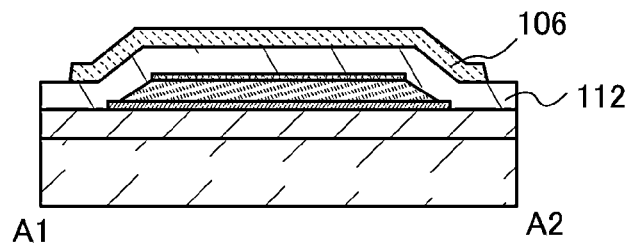

Next, the oxide semiconductor film to be the oxide semiconductor film 106 is processed, whereby the oxide semiconductor film 106 is formed (see FIG. 4B).

Next, first heat treatment may be performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, the crystallinity of the oxide semiconductor film 106 can be improved, and in addition, impurities such as hydrogen and water can be removed from the gate insulating film 112 and/or the oxide semiconductor film 106.

Next, a conductive film to be the source electrode 116a and the drain electrode 116b is formed. The conductive film to be the source electrode 116a and the drain electrode 116b can be formed using a conductive film selected from the conductive films given as examples of the source electrode 116a and the drain electrode 116b and can be formed by a sputtering method, a CVD method, an MBE method, an ALD method, or a PLD method.

Figure 4C:
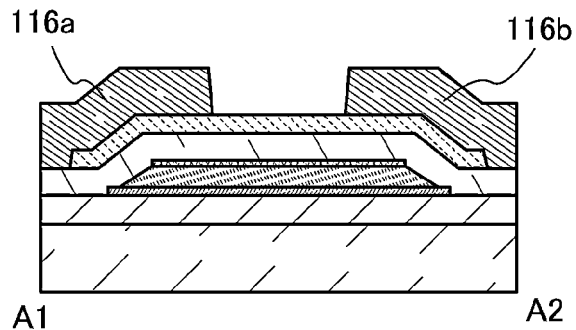
Figure 4D:
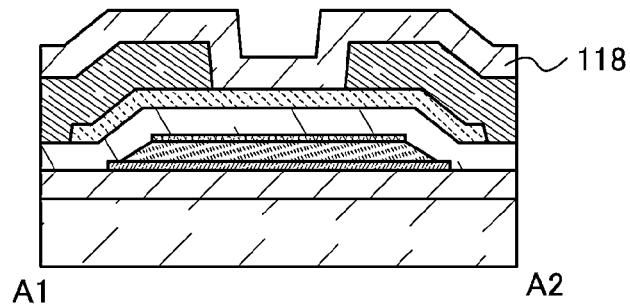

Next, the conductive film to be the source electrode 116a and the drain electrode 116b is processed, whereby the source electrode 116a and the drain electrode 116b are formed (see FIG. 4C).

Next, second heat treatment may be performed. Refer to the description of the first heat treatment for the second heat treatment.

Next, the protective insulating film 118 is formed. The protective insulating film 118 can be formed using an insulating film selected from the insulating films given as examples of the protective insulating film 118 and can be formed by a sputtering method, a CVD method, an MBE method, an ALD method, or a PLD method.

The protective insulating film 118 is preferably a stack of two or more different kinds of insulating films. For example, described below is the case where the protective insulating film 118 is a stack of a first insulating film and a second insulating film over the first insulating film. As the first insulating film, a silicon oxide film or a silicon oxynitride film is formed under the following conditions: the substrate placed in a treatment chamber of a plasma CVD apparatus, which is vacuum-evacuated, is held at a temperature higher than or equal to 300° C. and lower than or equal to 400° C., preferably higher than or equal to 320° C. and lower than or equal to 370° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power is supplied to an electrode provided in the treatment chamber.

Under the film formation conditions of the first insulating film, the bonding strength of silicon and oxygen becomes strong in the above substrate temperature range. Consequently, as the first insulating film, a dense and hard insulating film, typically, a silicon oxide film or a silicon oxynitride film having an etching rate lower than or equal to 10 nm/min or lower than or equal to 8 nm/min when etching is performed at 25° C. with 0.5 weight % of hydrofluoric acid can be formed. Note that since the oxide semiconductor film 106 is under the first insulating film, the pressure is preferably set high so that damage to the oxide semiconductor film 106 is reduced.

Here, as the first insulating film, a 10-nm-thick silicon oxynitride film is formed by a plasma CVD method under the following conditions: silane with a flow rate of 20 sccm and nitrous oxide with a flow rate of 3000 sccm are used as a source gas; the pressure in the treatment chamber is 200 Pa; the substrate temperature is 350° C.; and a high-frequency power of 0.016 W/cm$^2$ is supplied to parallel plate electrodes with a high-frequency power supply of 27.12 MHz. Under the above conditions, a dense and hard silicon oxynitride film can be formed.

The second insulating film is formed by a CVD method or a sputtering method.

As the second insulating film, a silicon oxide film or a silicon oxynitride film may be formed under the following conditions: the substrate placed in a treatment chamber of the plasma CVD apparatus, which is vacuum-evacuated, is held at a temperature higher than or equal to 180° C. and lower than or equal to 250° C., preferably higher than or equal to 180° C. and lower than or equal to 230° C., the pressure in the treatment chamber is greater than or equal to 100 Pa and less than or equal to 250 Pa or greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.26 W/cm$^2$ and lower than or equal to 0.35 W/cm$^2$ is supplied to an electrode provided in the treatment chamber.

As the film formation conditions of the second insulating film, the high-frequency power having the above power density is supplied to the treatment chamber having the above pressure, whereby the degradation efficiency of the source gas in plasma is increased, oxygen radicals are increased, and oxidation of the source gas is promoted; therefore, an insulating film containing excess oxygen is formed as the second insulating film. However, the bonding strength of silicon and oxygen is weak in the above substrate temperature range; therefore, part of oxygen is released by heating. Consequently, the second insulating film can contain excess oxygen and release oxygen by being heated.

Here, as the second insulating film, a 400-nm-thick silicon oxynitride film is formed by a plasma CVD method under the following conditions: silane with a flow rate of 160 sccm and nitrous oxide with a flow rate of 4000 sccm are used as a source gas; the pressure in the treatment chamber is 200 Pa; the substrate temperature is 220° C.; and a high-frequency power of 0.25 W/cm$^2$ is supplied to parallel plate electrodes with a high-frequency power supply of 27.12 MHz.

Next, third heat treatment may be performed. Refer to the description of the first heat treatment for the third heat treatment.

In this manner, the transistor in FIGS. 3A to 3C can be manufactured. In the transistor, the conductive film 104*b* included in the gate electrode 104 has a taper angle greater than or equal to 15° and less than or equal to 45°; thus, a shape defect of a layer over the gate electrode 104 (e.g., the gate insulating film 112) can be prevented from being caused.

This embodiment can be implemented in appropriate combination with any of the other embodiments and example.

Embodiment 3

In this embodiment, a display device to which the transistor described in the above embodiment is applied will be described.

As a display element provided in the display device, a liquid crystal element (also referred to as a liquid crystal display element), a light-emitting element (also referred to as a light-emitting display element), or the like can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used as the display element. In this embodiment, a display device including an EL element and a display device including a liquid crystal element will be described as examples of the display device.

Note that the display device in this embodiment includes in its category a panel in which a display element is sealed, and a module in which an IC such as a controller is mounted on the panel.

Additionally, the display device in this embodiment refers to an image display device, a display device, or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

Figure 5A:
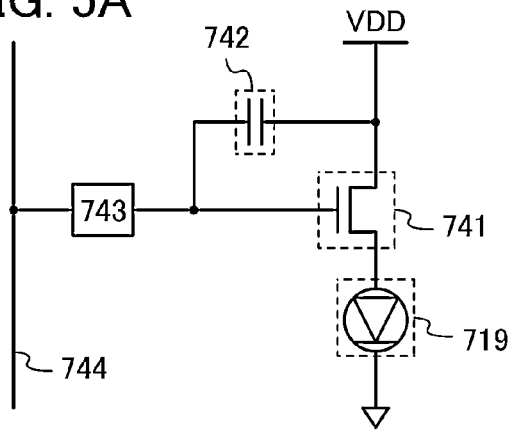
FIGS. 5A to 5C are a circuit diagram of a display device including an EL element according to one embodiment of the present invention, a cross-sectional view of part of a pixel of the display device, and a cross-sectional view of a light-emitting layer of the display device.

FIG. 5A is an example of a circuit diagram of the display device including an EL element.

The display device illustrated in FIG. 5A includes a switching element 743, a transistor 741, a capacitor 742, and a light-emitting element 719.

A gate of the transistor 741 is electrically connected to one terminal of the switching element 743 and one terminal of the capacitor 742. A source of the transistor 741 is electrically connected to one terminal of the light-emitting element 719. A drain of the transistor 741 is electrically connected to the other terminal of the capacitor 742 and is supplied with a power supply potential VDD. The other terminal of the switching element 743 is electrically connected to a signal line 744. The other terminal of the light-emitting element 719 is supplied with a fixed potential. Note that the fixed potential is a ground potential GND or lower. Note that the wiring illustrated in FIGS. 1A to 1D or FIGS. 2A to 2E can be used as a wiring such as the signal line 744. Since the wiring has reduced resistance, wiring delay can be reduced and a display device with high display quality can be provided.

Note that the transistor illustrated in FIGS. 3A to 3C is used as the transistor 741. Refer to the description on FIGS. 3A to 3C for the transistor 741. Since a shape defect of the transistor is prevented, the yield of the display device can be improved.

As the switching element 743, it is preferred to use a transistor. With a transistor, the area of a pixel can be reduced, so that a display device having a high resolution can be obtained. Moreover, as the switching element 743, the transistor illustrated in FIGS. 3A to 3C may be used. With the use of the transistor illustrated in FIGS. 3A to 3C as the switching element 743, the switching element 743 can be formed in the same process as the transistor 741; thus, the productivity of the display device can be improved.

Figure 5B:
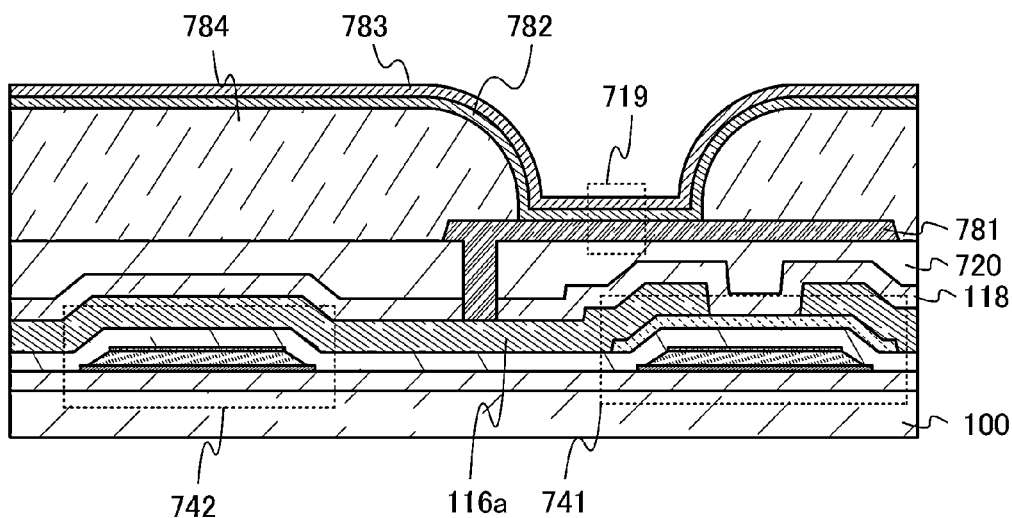

FIG. 5B illustrates part of a cross section of a pixel including the transistor 741, the capacitor 742, and the light-emitting element 719.

Note that FIG. 5B shows an example where the transistor 741 and the capacitor 742 are provided in the same plane. With such a structure, the capacitor 742 can be formed through the same steps as a gate electrode, a gate insulating film, and a source electrode (drain electrode), which are included in the transistor 741. When the transistor 741 and the capacitor 742 are provided in the same plane in this manner, the number of manufacturing steps of the display device can be reduced; thus, the productivity can be increased.

An insulating film 720 is provided over the transistor 741 and the capacitor 742.

Here, an opening reaching the source electrode 116a of the transistor 741 is provided in the insulating film 720 and the protective insulating film 118.

An electrode 781 is provided over the insulating film 720. The electrode 781 is connected to the source electrode 116a of the transistor 741 through the opening provided in the insulating film 720 and the protective insulating film 118.

A partition 784 having an opening reaching the electrode 781 is provided over the electrode 781.

A light-emitting layer 782 in contact with the electrode 781 through the opening provided in the partition 784 is provided over the partition 784.

An electrode 783 is provided over the light-emitting layer 782.

A region where the electrode 781, the light-emitting layer 782, and the electrode 783 overlap with one another serves as the light-emitting element 719.

Note that description of the protective insulating film 118 is referred to for the insulating film 720. Alternatively, a resin film of a polyimide resin, an acrylic resin, an epoxy resin, a silicone resin, or the like may be used.

Figure 5C:
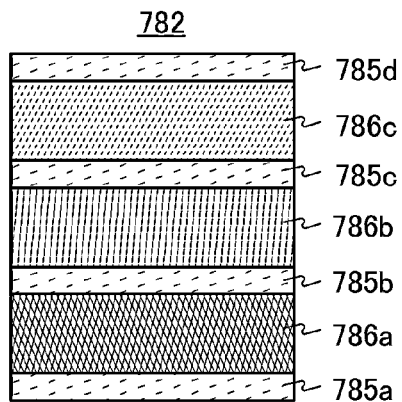

The light-emitting layer 782 is not limited to a single layer, and may be a stack of plural kinds of light-emitting layers and the like. For example, a structure illustrated in FIG. 5C may be employed. FIG. 5C illustrates the structure in which an intermediate layer 785a, a light-emitting layer 786a, an intermediate layer 785b, a light-emitting layer 786b, an intermediate layer 785c, a light-emitting layer 786c, and an intermediate layer 785d are stacked in this order. In that case, when light-emitting layers emitting light of appropriate colors are used as the light-emitting layer 786a, the light-emitting layer 786b, and the light-emitting layer 786c, the light-emitting element 719 with a high color rendering property or higher emission efficiency can be formed.

White light may be obtained by stacking plural kinds of light-emitting layers. Although not illustrated in FIG. 5B, white light may be extracted through coloring layers.

Although the structure in which three light-emitting layers and four intermediate layers are provided is shown here, the number of light-emitting layers and the number of intermediate layers can be changed as appropriate. For example, the light-emitting layer 782 can be formed with only the intermediate layer 785a, the light-emitting layer 786a, the intermediate layer 785b, the light-emitting layer 786b, and the intermediate layer 785c. Alternatively, the light-emitting layer 782 may be formed with the intermediate layer 785a, the light-emitting layer 786a, the intermediate layer 785b, the light-emitting layer 786b, the light-emitting layer 786c, and the intermediate layer 785d; the intermediate layer 785c may be omitted.

Further, the intermediate layer can be formed using a stacked-layer structure including any of a hole-injection layer, a hole-transport layer, an electron-transport layer, an electron-injection layer, and the like. Note that not all of these layers need to be provided as the intermediate layer. Any of these layers may be selected as appropriate to form the intermediate layer. Note that layers having similar functions may be provided. Further, an electron-relay layer or the like may be added as appropriate as the intermediate layer, in addition to a carrier generation layer.

The electrode 781 can be formed using a conductive film having a transmitting property with respect to visible light. To have a transmitting property with respect to visible light means that the average transmittance of light in a visible light region (for example, a wavelength range from 400 nm to 800 nm) is higher than or equal to 70%, particularly higher than or equal to 80%.

As the electrode 781, for example, a compound film such as an In—Zn—W—O compound film, an In—Sn—O compound film, an In—Zn—O compound film, an In—O compound film, a Zn—O compound film, or a Sn—O compound film can be used. The above compound film may contain a minute amount of Al, Ga, Sb, F, or the like. Further, a metal thin film having a thickness enough to transmit light (preferably, approximately 5 nm to 30 nm) can also be used. For example, an Ag film, a Mg film, or an Ag—Mg alloy film with a thickness of 5 nm may be used.

The electrode 781 is preferred to be a film which efficiently reflects visible light. For example, a film containing lithium, aluminum, titanium, magnesium, lanthanum, silver, silicon, or nickel can be used as the electrode 781.

The electrode 783 can be formed using any of the films for the electrode 781. Note that when the electrode 781 has a transmitting property with respect to visible light, it is preferred that the electrode 783 efficiently reflect visible light. When the electrode 781 efficiently reflects visible light, it is preferred that the electrode 783 have a transmitting property with respect to visible light.

Positions of the electrode 781 and the electrode 783 are not limited to the structure illustrated in FIG. 5B, and the electrode 781 and the electrode 783 may be replaced with each other. It is preferred to use a conductive film having a high work function for the electrode which serves as an anode and a conductive film having a low work function for the electrode which serves as a cathode. Note that in the case where a carrier generation layer is provided in contact with the anode, a variety of conductive films can be used for the anode regardless of their work functions.

Description of the protective insulating film 118 is referred to for the partition 784. Alternatively, a resin film of a polyimide resin, an acrylic resin, an epoxy resin, a silicone resin, or the like may be used.

A wiring connected to the light-emitting element 719 is a wiring whose resistance is reduced. Accordingly, wiring delay is reduced and a display device having high display quality can be provided. Further, since a shape defect of the transistor 741 is prevented, the yield of the display device can be improved.

Next, the display device including a liquid crystal element is described.

Figure 6A:
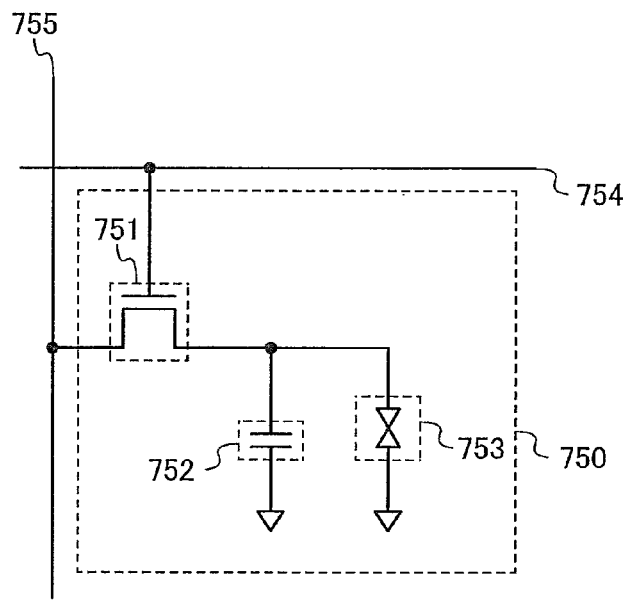
FIGS. 6A and 6B are a circuit diagram of a pixel of a display device including a liquid crystal element according to one embodiment of the present invention and a cross-sectional view of the pixel.

FIG. 6A is a circuit diagram illustrating a structure example of the pixel of the display device including a liquid crystal element. A pixel 750 illustrated in FIG. 6A includes a transistor 751, a capacitor 752, and an element in which liquid crystal is filled between a pair of electrodes (hereinafter also referred to as a liquid crystal element) 753.

One of a source and a drain of the transistor 751 is electrically connected to a signal line 755, and a gate of the transistor 751 is electrically connected to a scan line 754. Note that the wiring illustrated in FIGS. 1A to 1D or FIGS. 2A to 2E can be used as a wiring such as the signal line 755 or the scan line 754. Since the wiring has reduced resistance, wiring delay can be reduced and a display device with high display quality can be provided.

One of electrodes of the capacitor 752 is electrically connected to the other of the source and the drain of the transistor 751, and the other of the electrodes of the capacitor 752 is electrically connected to a wiring for supplying a common potential.

One of electrodes of the liquid crystal element 753 is electrically connected to the other of the source and the drain of the transistor 751, and the other of the electrodes of the liquid crystal element 753 is electrically connected to a wiring for supplying a common potential. Note that the common potential supplied to the other of the electrodes of the liquid crystal element 753 may be different from the common potential supplied to the wiring electrically connected to the other of the electrodes of the capacitor 752.

Figure 6B:
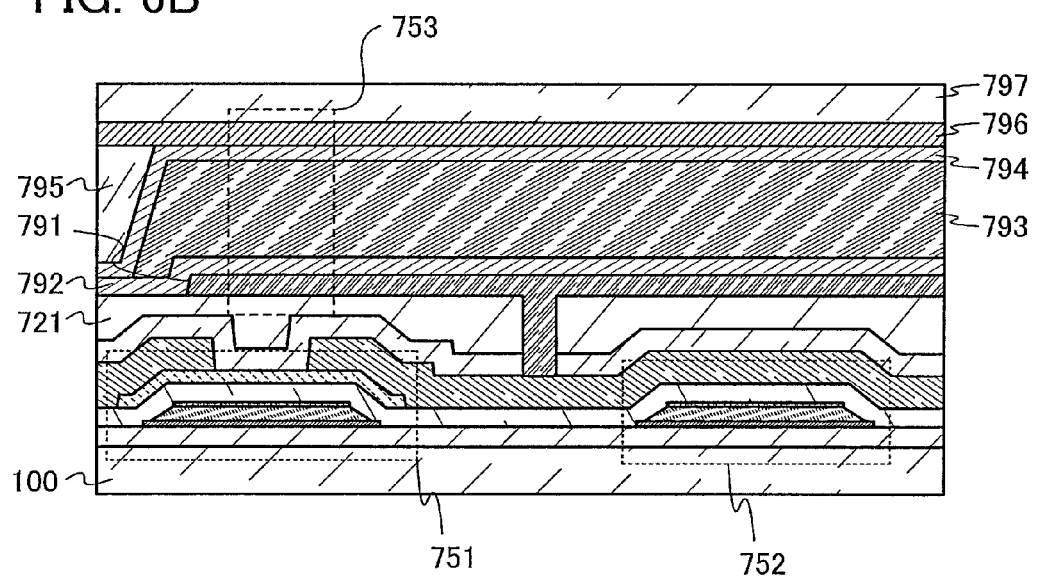

FIG. 6B illustrates part of a cross section of the pixel 750.

Note that FIG. 6B shows an example where the transistor 751 and the capacitor 752 are provided in the same plane. With such a structure, the capacitor 752 can be formed through the same steps as a gate electrode, a gate insulating film, and a source electrode (drain electrode), which are included in the transistor 751. When the transistor 751 and the capacitor 752 are provided in the same plane in this manner, the number of manufacturing steps of the display device can be reduced; thus, the productivity can be increased.

The transistor illustrated in FIGS. 3A to 3C can be used as the transistor 751. Refer to the description on FIGS. 3A to 3C for the transistor 751. Since a shape defect of the transistor 751 is prevented, the yield of the display device can be improved.

Note that the transistor 751 can be a transistor having extremely low off-state current. Thus, charge held in the capacitor 752 is unlikely to be leaked and a voltage applied to the liquid crystal element 753 can be retained for a long time. Accordingly, when a motion image with less movement or a still image is displayed, a voltage for operating the transistor 751 is not needed by turning off the transistor 751, whereby a display device with low power consumption can be obtained.

An insulating film 721 is provided over the transistor 751 and the capacitor 752.

Here, an opening reaching the drain electrode 116b of the transistor 751 is provided in the insulating film 721 and the protective insulating film 118.

An electrode 791 is provided over the insulating film 721. The electrode 791 is in contact with the drain electrode 116b of the transistor 751 through the opening provided in the insulating film 721 and the protective insulating film 118.

An insulating film 792 serving as an alignment film is provided over the electrode 791.

A liquid crystal layer 793 is provided over the insulating film 792.

An insulating film 794 serving as an alignment film is provided over the liquid crystal layer 793.

A spacer 795 is provided over the insulating film 794.

An electrode 796 is provided over the spacer 795 and the insulating film 794.

A substrate 797 is provided over the electrode 796.

Note that description of the protective insulating film 118 is referred to for the insulating film 721. Alternatively, a resin film of a polyimide resin, an acrylic resin, an epoxy resin, a silicone resin, or the like may be used.

For the liquid crystal layer 793, a thermotropic liquid crystal, a low-molecular liquid crystal, a polymer liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

For the liquid crystal layer 793, a liquid crystal exhibiting a blue phase may be used. In that case, the insulating films 792 and 794 serving as an alignment film are not necessarily provided.

The electrode 791 can be formed using a conductive film having a transmitting property with respect to visible light.

As the electrode 791, for example, a compound film such as an In—Zn—W—O compound film, an In—Sn—O compound film, an In—Zn—O compound film, an In—O compound film, a Zn—O compound film, or a Sn—O compound film can be used. The above compound film may contain a minute amount of Al, Ga, Sb, F, or the like. Further, a metal thin film having a thickness enough to transmit light (preferably, approximately 5 nm to 30 nm) can also be used.

The electrode 791 is preferred to be a film which efficiently reflects visible light. For example, a film containing aluminum, titanium, chromium, copper, molybdenum, silver, tantalum, or tungsten can be used as the electrode 791.

The electrode 796 can be formed using any of the films for the electrode 791. Note that when the electrode 791 has a transmitting property with respect to visible light, it is preferred that the electrode 796 efficiently reflect visible light. When the electrode 791 efficiently reflects visible light, it is preferred that the electrode 796 have a transmitting property with respect to visible light.

Positions of the electrode 791 and the electrode 796 are not limited to the structure illustrated in FIG. 6B, and the electrode 791 and the electrode 796 may be replaced with each other.

Each of the insulating films 792 and 794 may be formed using an organic compound or an inorganic compound.

The spacer 795 may be formed using an organic compound or an inorganic compound. Note that the spacer 795 can have a variety of shapes such as a columnar shape and a spherical shape.

A region where the electrode 791, the insulating film 792, the liquid crystal layer 793, the insulating film 794, and the electrode 796 overlap with one another serves as the liquid crystal element 753.

As the substrate 797, a glass substrate, a resin substrate, a metal substrate, or the like can be used. The substrate 797 may have flexibility.

A wiring connected to the liquid crystal element 753 is a wiring whose resistance is reduced. Accordingly, wiring delay is reduced and a display device having high display quality can be provided. Further, since a shape defect of the transistor 751 is prevented, the yield of the display device can be improved. Since the transistor 751 can have extremely low off-state current, a display device with low power consumption can be provided.

This embodiment can be implemented in appropriate combination with any of the other embodiments and example.

Embodiment 4

In this embodiment, examples of an electronic device including any of the semiconductor devices described in the above embodiment will be described.

Figure 7A:
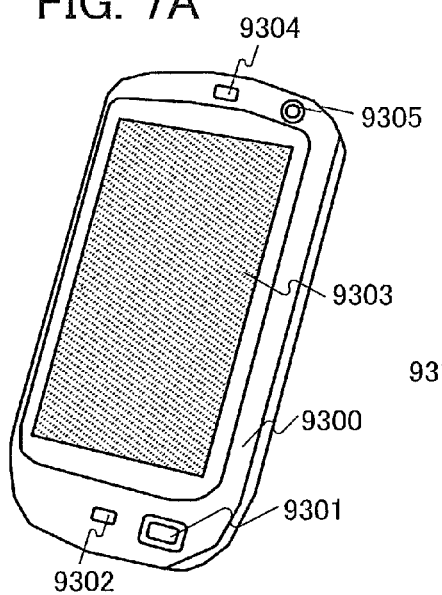
FIGS. 7A to 7D each illustrate an electronic device according to one embodiment of the present invention.

FIG. 7A illustrates a portable information terminal. The portable information terminal illustrated in FIG. 7A includes a housing 9300, a button 9301, a microphone 9302, a display portion 9303, a speaker 9304, and a camera 9305, and has a function as a mobile phone. One embodiment of the present invention can be applied to the display portion 9303.

Figure 7B:
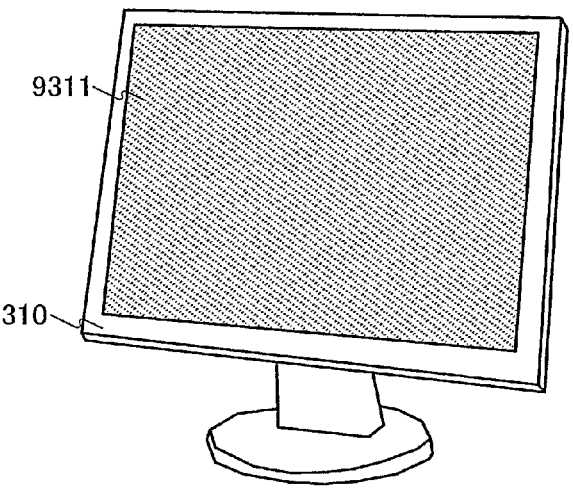

FIG. 7B illustrates a display. The display illustrated in FIG. 7B includes a housing 9310 and a display portion 9311. One embodiment of the present invention can be applied to the display portion 9311.

Figure 7C:
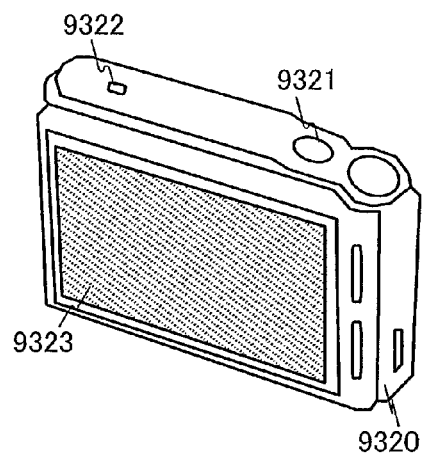

FIG. 7C illustrates a digital still camera. The digital still camera illustrated in FIG. 7C includes a housing 9320, a button 9321, a microphone 9322, and a display portion 9323. One embodiment of the present invention can be applied to the display portion 9323.

Figure 7D:
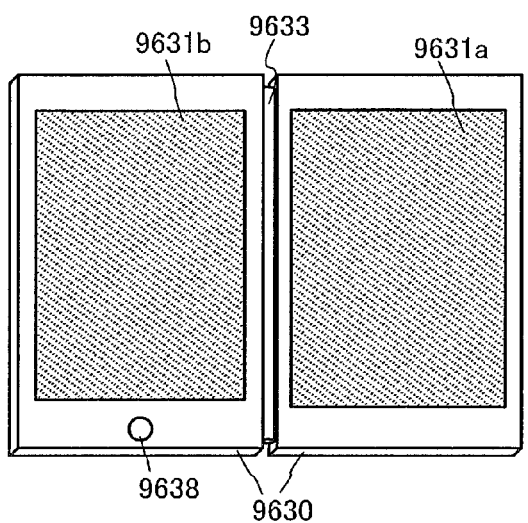

FIG. 7D illustrates a double-foldable portable information terminal. The double-foldable portable information terminal illustrated in FIG. 7D includes a housing 9630, a display portion 9631*a*, a display portion 9631*b*, a hinge 9633, and an operation switch 9638. One embodiment of the present invention can be applied to the display portion 9631*a* and the display portion 9631*b*.

Part or whole of the display portion 9631*a* and/or the display portion 9631*b* can function as a touch panel. By touching an operation key displayed on the touch panel, a user can input data, for example.

By application of one embodiment of the present invention, an electronic device including a display device with high display quality can be provided.

This embodiment can be implemented in appropriate combination with any of the other embodiments and example.

Example 1

In this example, a sample obtained by processing a stack including a copper film was evaluated by observation of a cross section and a plane of the sample with a scanning transmission electron microscope (STEM) and a scanning ion microscope (SIM), respectively.

Note that an Ultra-thin Film Evaluation System HD-2300 manufactured by Hitachi High-Technologies Corporation was used as the STEM. Further, "SMI 3200" manufactured by Seiko Instruments Inc. was used as the SIM.

Figure 8A:
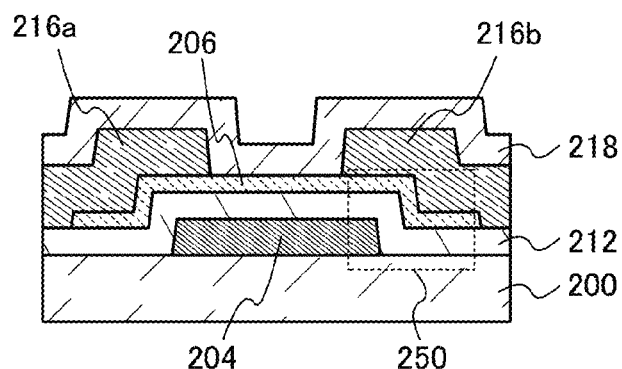
FIGS. 8A and 8B are a schematic view and an observation image of a cross section of a comparative sample 1.

First, a comparative sample 1 is described. FIG. 8A is a schematic cross-sectional view of a transistor which is the comparative sample 1.

The comparative sample 1 illustrated in FIG. 8A is a transistor including a glass substrate 200, a gate electrode 204 over the glass substrate 200, a gate insulating film 212 over the glass substrate 200 and the gate electrode 204, an oxide semiconductor film 206 provided over the gate electrode 204 with the gate insulating film 212 therebetween, a source electrode 216*a* and a drain electrode 216*b* over the gate insulating film 212 and the oxide semiconductor film 206, and a protective insulating film 218 over the oxide semiconductor film 206, the source electrode 216*a*, and the drain electrode 216*b*.

In the transistor in FIG. 8A, the gate electrode 204 includes a 30 nm thick tantalum nitride film and a 200 nm thick copper film over the tantalum nitride film.

The gate insulating film 212 includes a 325 nm thick silicon nitride film and a 50 nm thick silicon oxynitride film over the silicon nitride film.

The oxide semiconductor film 206 is a 35 nm thick In—Ga—Zn—O compound film.

The source electrode 216*a* and the drain electrode 216*b* each include a 50 nm thick tungsten film, a 400 nm thick aluminum film over the tungsten film, and a 100 nm thick titanium film over the aluminum film.

Figure 8B:
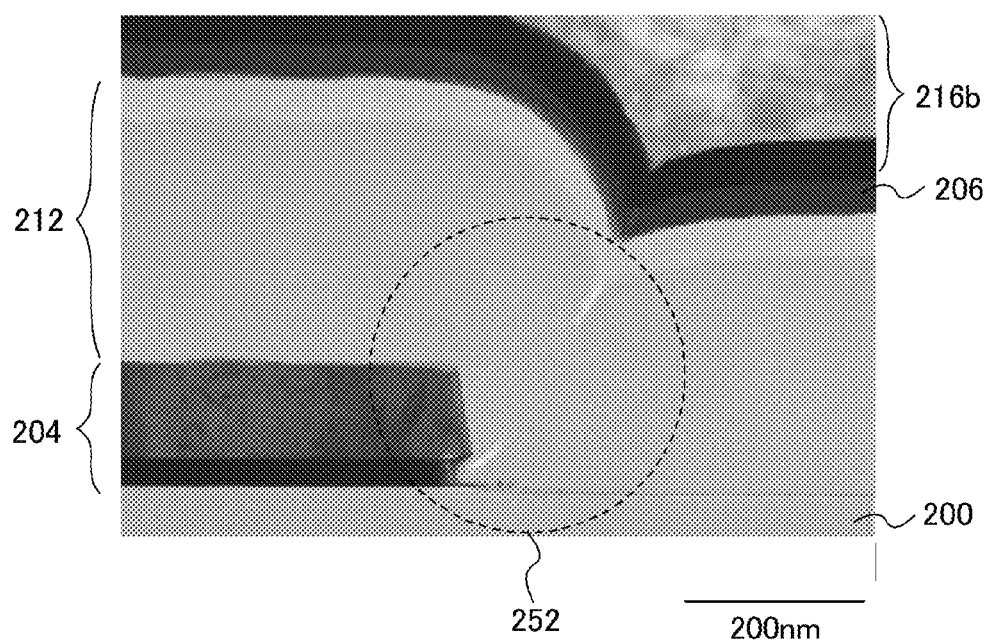

FIG. 8B is an observation image of a cross section of the comparative sample 1 in a region 250, which is obtained with the STEM. Note that FIG. 8B is a phase contrast image (also referred to as transmitted electron (TE) image) at 150,000-fold magnification.

As shown in the TE image in FIG. 8B, a cavity attributed to the shape of the gate electrode 204 is found in a region 252 in the comparative sample 1. The cavity in the region 252 might cause shape defects of the oxide semiconductor film 206 and the drain electrode 216*b*.

Next, comparative samples 2 to 4 are described. The comparative samples 2 to 4 are samples each obtained by etching a copper film 304 in a structure shown by a schematic cross-sectional view in FIG. 9A to form a wiring.

Figure 9A:
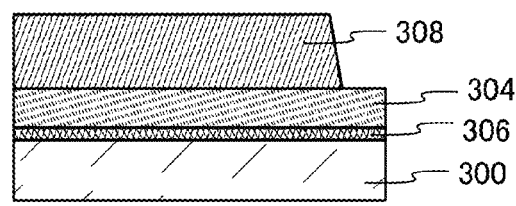
FIGS. 9A to 9D are a schematic view of a cross section of a sample for forming comparative samples 2 to 4 and observation images of cross sections of the comparative samples 2 to 4.

The structure in FIG. 9A includes a glass substrate 300, a conductive film 306 over the glass substrate 300, the copper film 304 over the conductive film 306, and a resist mask 308 over the copper film 304.

The thickness of the copper film 304 is 200 nm.

A sample to be the comparative sample 2 is a sample in which a 35 nm thick titanium film is used as the conductive film 306. A sample to be the comparative sample 3 is a sample in which a 30 nm thick tantalum nitride film is used as the conductive film 306. A sample to be the comparative sample 4 is a sample in which a 30 nm thick tungsten film is used as the conductive film 306.

The samples to be the comparative samples 2 to 4 are subjected to treatment using an aqueous solution containing hydrogen peroxide and carboxylic acid (chemical solution A) at 30° C. for 60 seconds, whereby the comparative samples 2 to 4 are obtained.

Figure 9B:
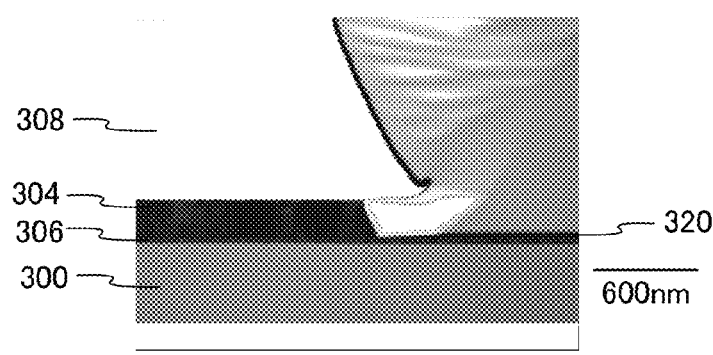
Figure 9C:
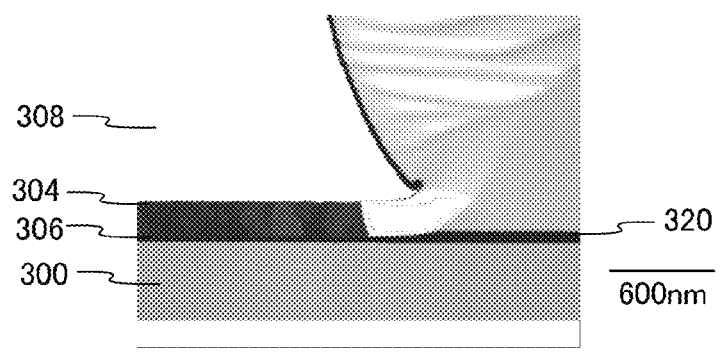
Figure 9D:
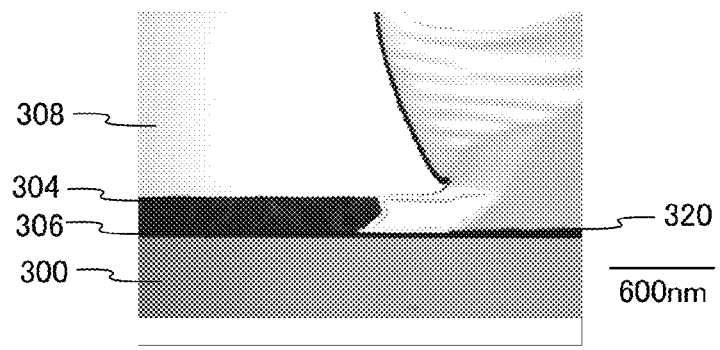

FIGS. 9B to 9D are observation images of cross sections of the comparative samples 2 to 4, respectively, which are obtained with the STEM. FIGS. 9B to 9D are TE images at 50,000-fold magnification. Note that each sample is covered with a platinum film 320 before observation so that observation images of the cross sections are easily obtained with the STEM.

In the comparative sample 2, the taper angle of the copper film 304 is 65°. In the comparative sample 3, the taper angle of the copper film 304 is 78°. In the comparative sample 4, the taper angle of the copper film 304 is 145°.

In the comparative sample 4, the copper film 304 has a so-called inverted tapered shape (a shape in which the taper angle is larger than 90°). It seems that the shape shown in FIG. 9D is obtained because the copper film 304 is etched more rapidly on a side in contact with the conductive film 306 than on the other side which is not in contact with the conductive film 306, which is a tungsten film. The observation images of the cross sections of the comparative samples 2 to 4 suggest that the shape of the copper film 304 can be controlled by the kind of conductive film used as the conductive film 306 under the copper film 304.

Next, a sample 1 is described. The sample 1 is a sample obtained by etching a copper film 404 in a structure shown by a schematic cross-sectional view in FIG. 10A to form a wiring.

Figure 10A:
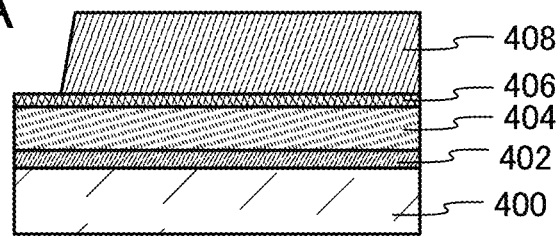
FIGS. 10A to 10C are a schematic view of a cross section of a sample for forming a sample 1 and observation images of cross sections of the sample 1.

The structure in FIG. 10A includes a glass substrate 400, a tantalum nitride film 402 over the glass substrate 400, the copper film 404 over the tantalum nitride film 402, a tungsten film 406 over the copper film 404, and a resist mask 408 over the tungsten film 406.

Note that the thicknesses of the tantalum nitride film 402, the copper film 404, and the tungsten film 406 are 30 nm, 200 nm, and 5 nm, respectively.

A method for forming the sample 1 is described. First, the tungsten film 406 in the structure shown in FIG. 10A was etched with use of the resist mask 408 as a mask. A dry etching method was used for the etching. Next, treatment was performed with an aqueous solution containing hydrogen peroxide and carboxylic acid (chemical solution A) at 30° C. for 60 seconds; thus, the sample 1 was obtained.

Figure 10B:
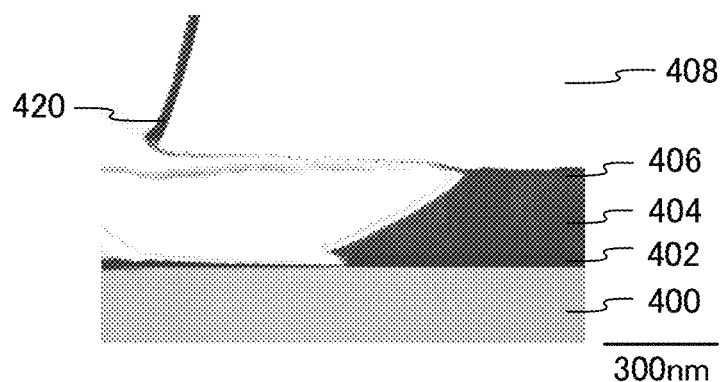
Figure 10C:
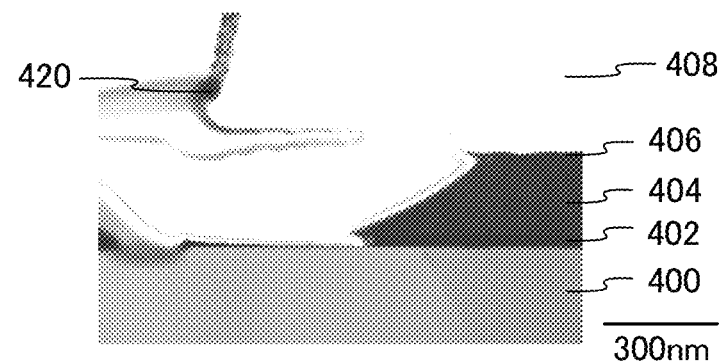

FIGS. 10B and 10C are observation images of cross sections of the sample 1, which are obtained with the STEM. FIG. 10B shows a region around an end portion of the glass substrate 400, and FIG. 10C shows a region around the center of the glass substrate 400. Note that FIGS. 10B and 10C are TE images at 100,000-fold magnification. Note that the sample 1 is covered with a platinum film 420 before observation so that observation images of the cross sections are easily obtained with the STEM.

In the sample 1, the taper angle of the copper film 404 is 28° in FIG. 10B, and the taper angle of the copper film 404 is 28° in FIG. 10C. It is found that in the sample 1, the copper film 404 can have a small taper angle. It is also found that the shape of the copper film 404 is highly uniform over the glass substrate 400. Note that the glass substrate 400 has a size of 600 mm×720 mm.

Also in the sample 1, it seems that the shape shown in FIGS. 10B and 10C is obtained because the copper film 404 is etched more rapidly on a side in contact with the tungsten film 406 than on the other side which is not in contact with the tungsten film 406.

Next, the tantalum nitride film 402 in the sample 1 was etched with use of the resist mask 408 as a mask. Then, the resist mask was removed. Then, two-fluid cleaning and megasonic cleaning were performed, whereby a region of the tungsten film 406 which was not in contact with the copper film 404 was removed.

Next, a 50 nm thick silicon nitride film and a 200 nm thick silicon oxynitride film over the silicon nitride film were formed; thus, a sample 2 was formed.

Figure 11A:
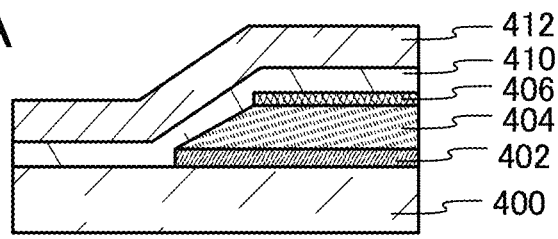
FIGS. 11A to 11C are a schematic view of a cross section of a sample 2 and observation images of cross sections of the sample 2.
Figure 11B:
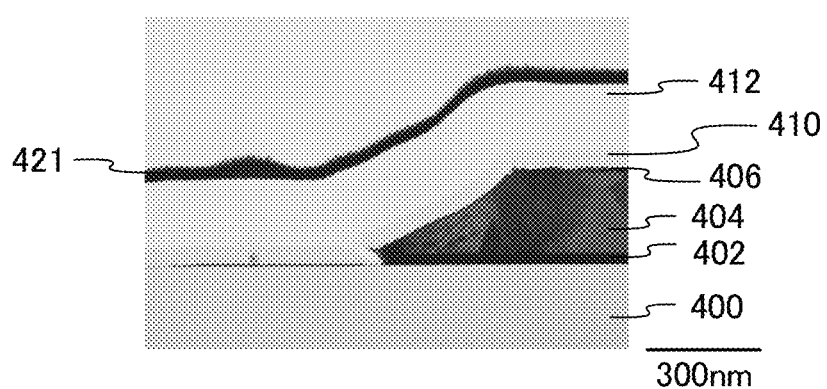
Figure 11C:
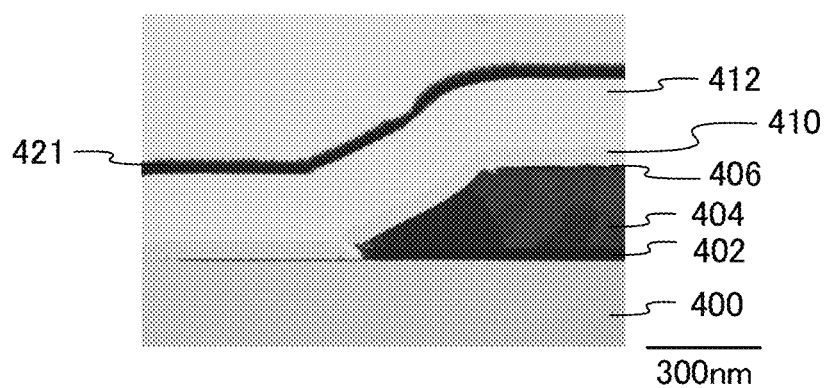

FIG. 11A is a schematic cross-sectional view of the sample 2. FIGS. 11B and 11C are observation images of cross sections of the sample 2, which are obtained with the STEM. FIG. 11B shows a region around an end portion of the glass substrate 400, and FIG. 11C shows a region around the center of the glass substrate 400. Note that FIGS. 11B and 11C are TE images at 100,000-fold magnification. Note that the sample 2 is covered with a platinum film 421 before observation so that observation images of the cross sections are easily obtained with the STEM.

In the sample 2, the taper angle of the copper film 404 is 27° in FIG. 11B, and the taper angle of the copper film 404 is 30° in FIG. 11C.

It is found that a 50 nm thick silicon nitride film 410 and a 200 nm thick silicon oxynitride film 412 over the silicon nitride film 410 were formed with good coverage in the sample 2.

Figure 12A:
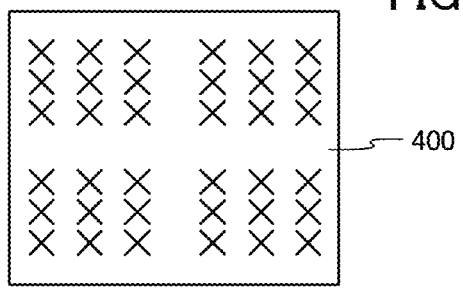
FIGS. 12A and 12B show observation images of a plane of the sample 2 which are obtained at plural points over a substrate.
Figure 12B:
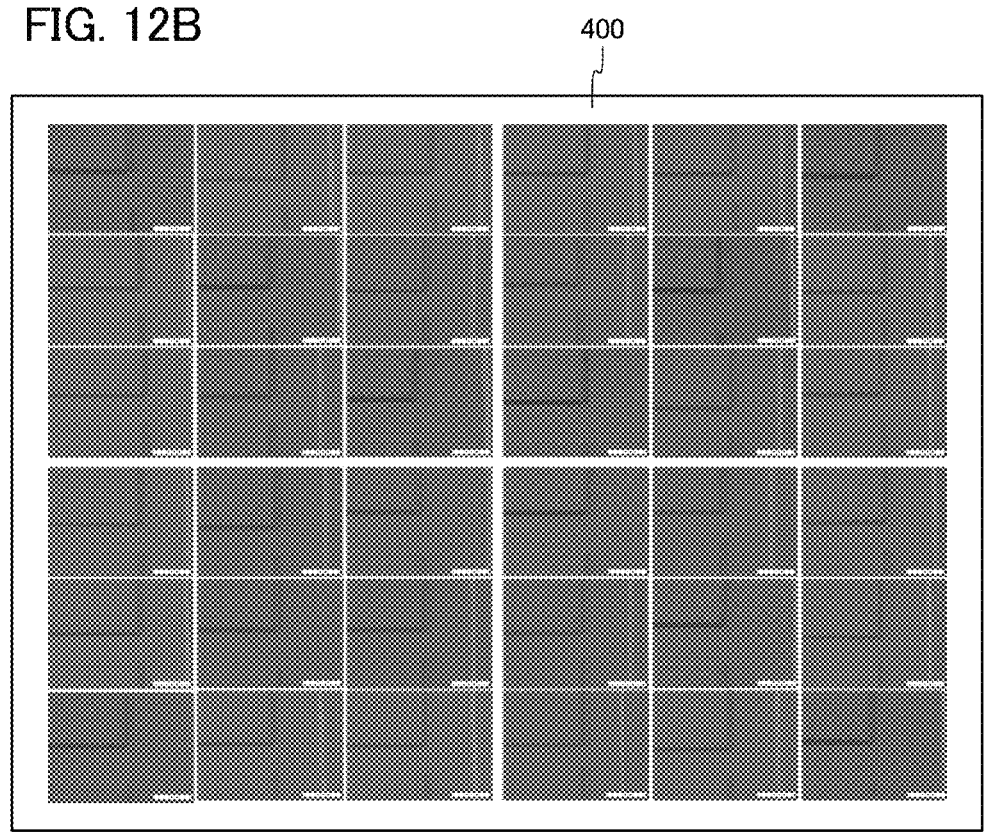

FIGS. 12A and 12B show observation images of a plane of the sample 2 at 36 points over the glass substrate 400, which is obtained with the SIM. In FIG. 12A, "X" represents points where the observation images are obtained with the SIM. FIG. 12B shows the observation images of the plane obtained with the SIM, which corresponds to the observation points in FIG. 12A.

As shown in FIG. 12B, it is found that the copper film 404 was able to be processed highly uniformly over the glass substrate 400 in the sample 2.

Described next are samples 3 to 5 which each have a structure similar to that of the sample 1 and include a conductive film 506 instead of the tungsten film 406.

Figure 13A:
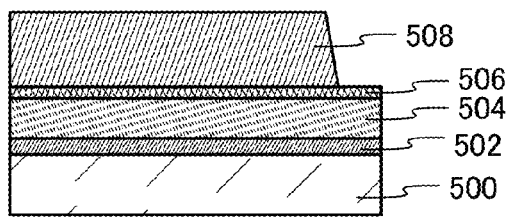
FIGS. 13A to 13D are a schematic view of a cross section of a sample for forming samples 3 to 5 and observation images of cross sections of the samples 3 to 5.

The structure in FIG. 13A includes a glass substrate 500, a tantalum nitride film 502 over the glass substrate 500, a copper film 504 over the tantalum nitride film 502, the conductive film 506 over the copper film 504, and a resist mask 508 over the conductive film 506.

Note that the thicknesses of the tantalum nitride film 502 and the copper film 504 are 30 nm and 200 nm, respectively.

A sample to be the sample 3 is a sample in which a 30 nm thick molybdenum film is used as the conductive film 506. Samples to be the samples 4 and 5 are each a sample in which a 30 nm thick molybdenum nitride film is used as the conductive film 506.

The samples to be the samples 3 and 4 are subjected to treatment using an aqueous solution containing hydrogen peroxide and carboxylic acid (chemical solution A) at 30° C. for 60 seconds, whereby the samples 3 and 4 are obtained.

The conductive film 506, which is a molybdenum nitride film, in the sample to be the sample 5 was etched with use of the resist mask 508 as a mask. A dry etching method was used for the etching. Next, treatment was performed with an aqueous solution containing hydrogen peroxide and carboxylic acid (chemical solution A) at 30° C. for 60 seconds; thus, the sample 5 was obtained.

Figure 13B:
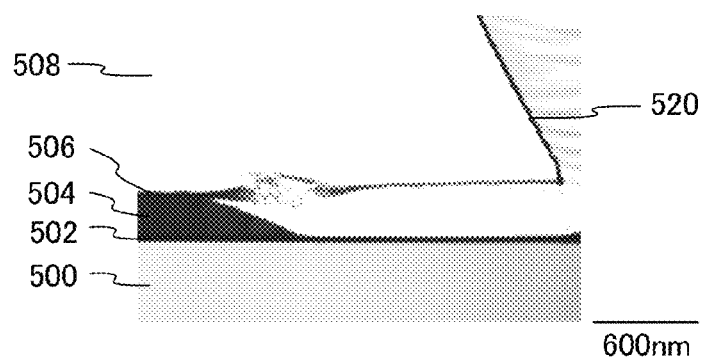
Figure 13C:
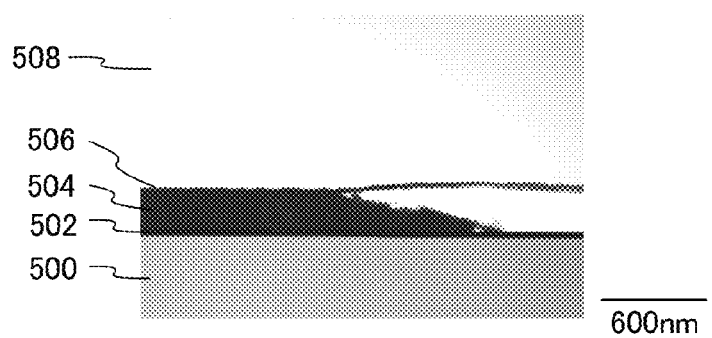
Figure 13D:
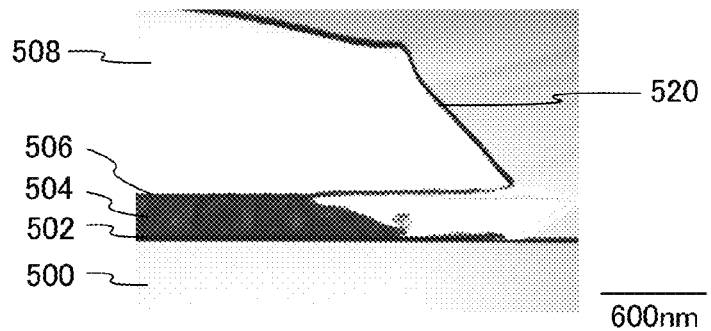

FIGS. 13B to 13D are observation images of cross sections of the samples 3 to 5, respectively, which are obtained with the STEM. FIGS. 13B to 13D are TE images at 50,000-fold magnification. Note that each sample is covered with a platinum film 520 before observation so that observation images of the cross sections are easily obtained with the STEM.

In the sample 3, the taper angle of the copper film 504 is 26°. In the sample 4, the taper angle of the copper film 504 is 18°. In the sample 5, the taper angle of the copper film 504 is 22°.

Also in the samples 3 to 5, it seems that the shape shown in FIGS. 13B to 13D is obtained because the copper film 504 is etched more rapidly on a side in contact with the conductive film 506 than on the other side which is not in contact with the conductive film 506.

According to this example, it is confirmed that the shape of a copper film can be controlled by selecting an appropriate film as a conductive film in contact with the copper film. It is also confirmed that by control of the shape of the copper film, a shape defect of a layer over the copper film can be prevented.

This application is based on Japanese Patent Application serial no. 2012-108832 filed with Japan Patent Office on May 10, 2012, the entire contents of which are hereby incorporated by reference.

What is claimed is:

1. A method for forming a wiring, comprising the steps of:
   forming a first conductive film comprising copper over a substrate;
   forming a second conductive film comprising at least one of tungsten, cobalt, nickel, tin, and molybdenum over the first conductive film;
   forming a resist mask over the second conductive film;
   etching a part of the second conductive film with use of the resist mask as a mask;
   oxidizing the second conductive film to oxidize copper in the first conductive film with oxygen which moves from the second conductive film to the first conductive film;
   removing part of the first conductive film so that the first conductive film has a taper angle greater than or equal to 15° and less than or equal to 45°; and
   removing the resist mask.

2. The method for forming a wiring according to claim 1 further comprising the step of:
   removing a region of the second conductive film after removing the resist mask, wherein the region is not in contact with the first conductive film.

3. The method for forming a wiring according to claim 1, wherein a region of the first conductive film which is in contact with the second conductive film is etched more rapidly than other region of the first conductive film which is not in contact with the second conductive film.

4. The method for forming a wiring according to claim 1, wherein an insulating film comprising nitrogen or a conductive film comprising nitrogen is provided under the first conductive film.

5. The method for forming a wiring according to claim 1, wherein the second conductive film is removed after removing the resist mask.

* * * * *